(12) United States Patent
Yoshioka et al.

(10) Patent No.: US 11,587,721 B2
(45) Date of Patent: Feb. 21, 2023

(54) INDUCTOR COMPONENT AND SUBSTRATE WITH BUILT-IN INDUCTOR COMPONENT

(71) Applicant: Murata Manufacturing Co., Ltd., Kyoto-fu (JP)

(72) Inventors: Yoshimasa Yoshioka, Nagaokakyo (JP); Mizuho Katsuta, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 188 days.

(21) Appl. No.: 17/076,529

(22) Filed: Oct. 21, 2020

(65) Prior Publication Data

US 2021/0125769 A1  Apr. 29, 2021

(30) Foreign Application Priority Data

Oct. 25, 2019 (JP) .............................. JP2019-194426

(51) Int. Cl.
*H01F 27/28* (2006.01)
*H01F 27/255* (2006.01)
(Continued)

(52) U.S. Cl.
CPC ....... *H01F 27/2804* (2013.01); *H01F 27/255* (2013.01); *H01F 27/32* (2013.01); *H01F 41/041* (2013.01); *H05K 1/165* (2013.01)

(58) Field of Classification Search
CPC ................ H01F 17/0006; H01F 17/04; H01F 2017/048; H01F 27/255; H01F 27/2804;
(Continued)

(56) References Cited

U.S. PATENT DOCUMENTS 6,280,858 B1 *  8/2001  Teshima .............. H05K 3/3463
                                                       428/646
2002/0017018 A1 *  2/2002  Ohkawara ............ G11B 5/3903
                                                       29/603.18
(Continued)

FOREIGN PATENT DOCUMENTS

CN   107818864 A   3/2018
CN   110136921 A   8/2019
(Continued)

OTHER PUBLICATIONS

An Office Action mailed by China National Intellectual Property Administration dated Mar. 8, 2022, which corresponds to Chinese Patent Application No. 202011146010.8 and is related to U.S. Appl. No. 17/076,529 with English language translation.
(Continued)

*Primary Examiner* — Timothy J Thompson
*Assistant Examiner* — Rhadames Alonzo Miller
(74) *Attorney, Agent, or Firm* — Studebaker & Brackett PC

(57) ABSTRACT

An inductor component includes a main body formed in a flat-plate shape and including a magnetic layer; an inductor wiring line disposed on a plane inside the main body; a first vertical wiring line that extends, from a pad portion which is an end portion of the inductor wiring line, in a first direction to pass through the inside of the main body, and is exposed on a first principal surface side of the main body; a second vertical wiring line that extends, from the pad portion of the inductor wiring line, in a second direction to pass through the inside of the main body, and is exposed on a second principal surface side of the main body; and an insulation layer of a non-magnetic body. The first vertical wiring line includes a via conductor and a columnar wiring
(Continued)

line. The second vertical wiring line includes a columnar wiring line.

20 Claims, 10 Drawing Sheets

(51) Int. Cl.
*H01F 41/04* (2006.01)
*H05K 1/16* (2006.01)
*H01F 27/32* (2006.01)

(58) Field of Classification Search
CPC ...... H01F 27/292; H01F 27/32; H01F 27/324; H01F 41/041; H05K 1/165; H05K 1/185; H05K 2201/0215; H05K 2201/086; H05K 2203/1469; H05K 3/4602
See application file for complete search history.

(56) References Cited

U.S. PATENT DOCUMENTS

| | | | | |
|---|---|---|---|---|
| 2003/0137053 | A1* | 7/2003 | Okayama | H01L 21/76877 257/E21.585 |
| 2004/0219341 | A1* | 11/2004 | Kataoka | H05K 3/388 428/209 |
| 2014/0145816 | A1* | 5/2014 | Sato | H01F 17/0013 336/208 |
| 2015/0084729 | A1* | 3/2015 | Lee | H01F 17/0013 336/192 |
| 2016/0035476 | A1* | 2/2016 | Mimura | H01F 41/046 336/199 |
| 2017/0098997 | A1* | 4/2017 | Hamada | H01F 1/0306 |
| 2017/0345552 | A1* | 11/2017 | Nakano | H01F 27/292 |
| 2018/0075965 | A1* | 3/2018 | Yoshioka | H01F 27/292 |
| 2020/0013544 | A1* | 1/2020 | Yoshioka | H01F 27/292 |
| 2020/0027645 | A1* | 1/2020 | Yoshioka | H01F 27/255 |
| 2020/0373079 | A1* | 11/2020 | Yoshioka | H01F 27/29 |

FOREIGN PATENT DOCUMENTS

| | | |
|---|---|---|
| JP | 2004-319875 A | 11/2004 |
| JP | 2014-197590 A | 10/2014 |
| JP | 2016-032050 A | 3/2016 |
| JP | 2017-069523 A | 4/2017 |
| JP | 2018-046051 A | 3/2018 |
| JP | 2019-046993 A | 3/2019 |
| JP | 2019-134141 A | 8/2019 |
| JP | 2019-165221 A | 9/2019 |

OTHER PUBLICATIONS

An Office Action; "Notice of Reasons for Refusal," mailed by the Japanese Patent Office dated Apr. 19, 2022, which corresponds to Japanese Patent Application No. 2019-194426 and is related to U.S. Appl. No. 17/076,529 with English language translation.

* cited by examiner

INDUCTOR COMPONENT AND SUBSTRATE WITH BUILT-IN INDUCTOR COMPONENT

CROSS-REFERENCE TO RELATED APPLICATION

This application claims benefit of priority to Japanese Patent Application No. 2019-194426, filed Oct. 25, 2019, the entire content of which is incorporated herein by reference.

BACKGROUND

Technical Field

The present disclosure relates to an inductor component and a substrate with a built-in inductor component.

Background Art

As a substrate with a built-in inductor component, a substrate disclosed in Japanese Unexamined Patent Application Publication No. 2004-319875 has been known. The disclosed substrate with a built-in inductor component includes an inductor component of a wire-wound structure and a substrate in which the inductor component is embedded. The coil diameter of the winding wire of the inductor component is in parallel to a thickness direction of the substrate.

In Japanese Unexamined Patent Application Publication No. 2014-197590, there is disclosed an inductor component that includes an inductor wiring line wound in a planar shape, and a first magnetic layer and a second magnetic layer located at positions sandwiching the inductor wiring line from both sides in a normal direction of a plane on which the inductor wiring line is wound. The outer shape of the inductor component is a substantially rectangular parallelepiped, and has an upper surface and a lower surface that are perpendicular to the normal direction, and four side surfaces parallel to the normal direction. The stated inductor is a surface-mount chip component, and the inductor wiring line is connected to an outside terminal via an extended portion (a terminal electrode+an extended electrode) connected to an outer circumferential end of the inductor wiring line. The extended portion is exposed from the side surface to the outside and the outside terminal is exposed from the upper surface to the outside, so as to constitute an L-shaped outside terminal.

SUMMARY

As inductor components are miniaturized and reduced in height, the three-dimensional mounting of an inductor component in which a system in package (SiP) technology, a package on package (PoP) technology, or the like is applied is being studied in addition to the known surface mounting. For example, by embedding an inductor component in a substrate, it is possible to reduce the size and the thickness of the system as a whole. However, in the substrate with a built-in inductor of Japanese Unexamined Patent Application Publication No. 2004-319875, it is difficult to maintain the characteristics of the inductor component when the substrate is thinned, because the inductor component has a wire-wound structure, the coil diameter of the winding wire is parallel to the thickness direction of the substrate, and the like.

It is conceivable to embed the inductor component of Japanese Unexamined Patent Application Publication No. 2014-197590 in a substrate such that the plane on which the inductor wiring line is wound and the thickness direction of the substrate are orthogonal to each other. This allows the characteristics of the inductor component to be less affected by the reduction in thickness of the substrate.

On the other hand, the inductor component of Japanese Unexamined Patent Application Publication No. 2014-197590 is assumed to be mounted by surface mounting, and it is hard to say that the stated inductor component is configured to be mounted by three-dimensional mounting. For example, in the inductor component of Japanese Unexamined Patent Application Publication No. 2014-197590, the inductor wiring line is once extended to a side-surface side of the inductor component (in a direction along the plane on which the inductor wiring line is wound=in a principal surface direction of the substrate) by the extended portion, and then is connected to the outside terminal. In this configuration, it is assumed that, in the surface mounting, the wiring pattern of the substrate extends along the principal surface of the substrate and is connected to the inductor component from the side-surface side thereof. On the other hand, in the three-dimensional mounting, the wiring pattern of the substrate is connected to the inductor component from the upper surface side or the lower surface side. However, when the inductor wiring line is once extended to the side-surface side, as in the inductor component of Japanese Unexamined Patent Application Publication No. 2014-197590, the wiring pattern once makes a detour to the side-surface side of the inductor component and then is connected to the inductor wiring line, and thus, unnecessary wiring routing is produced.

Not only the L-shaped outside terminals as in the inductor component of Japanese Unexamined Patent Application Publication No. 2014-197590, but also the outside terminals of the surface-mount inductor components including a bottom electrode inductor component in which the outside terminals are exposed from only the upper surface or the lower surface are respectively disposed basically close to side-surface sides. The reason for this is as follows: in the surface mounting, since the inductor component is solder-mounted on the substrate, an interval between the outside terminals is widened as much as possible in order to prevent a short circuit between the electrodes due to the spread-out of the solder. On the other hand, in the three-dimensional mounting, the connection between the inductor component and the wiring pattern of the substrate is not limited to solder mounting. Therefore, the wide interval between the outside terminals may bring about unnecessary wiring routing.

Accordingly, the present disclosure provides an inductor component and a substrate with a built-in inductor component that may enhance the degree of freedom in circuit design by supporting the three-dimensional mounting as well.

In order to accomplish the above object, an inductor component as an aspect of the present disclosure includes a main body that is formed in a flat-plate shape and includes a magnetic layer containing a resin and metal magnetic powder contained in the resin; an inductor wiring line disposed on a plane inside the main body; a first vertical wiring line that extends, from a pad portion which is an end portion of the inductor wiring line, in a first direction which is a normal direction with respect to the plane, in such a manner as to pass through the inside of the main body, and is exposed on a first principal surface side of the main body; and a second vertical wiring line that extends, from the pad portion of the inductor wiring line, in a second direction which is a normal direction with respect to the plane, in such a manner as to pass through the inside of the main body, and is exposed on a second principal surface side of the main body. The inductor component further includes an insulation layer of a non-magnetic body in contact with at least, of a first surface on the first direction side and a side surface of the inductor wiring line, the first surface. The first vertical wiring line includes a via conductor that extends from the pad portion toward the first direction side and passes through the inside of the insulation layer, and a columnar wiring line that extends from the via conductor toward the first direction side and passes through the inside of the magnetic layer. The second vertical wiring line includes a columnar wiring line that extends from the pad portion toward the second direction side and passes through the inside of the magnetic layer.

In the present specification, the inductor wiring line is a circuit element for providing inductance to the inductor component by generating magnetic flux in the magnetic layer when a current flows therethrough, and the structure, shape, material, and the like thereof are not particularly limited.

According to the inductor component of the present disclosure, since the first and second vertical wiring lines are extended in the first direction and the second direction respectively with respect to the inductor wiring line, the degree of freedom in connection with the wiring line of the mounting substrate is enhanced. In the inductor component, for example, wiring connection to an input terminal may be carried out only from the upper side, and wiring connection to an output terminal may be carried out only from the lower side. Since the first and second vertical wiring lines are extended in the first direction and the second direction respectively with respect to the inductor wiring line, the upper and lower stresses may be approximated to each other with respect to the inductor wiring line of the inductor component, so that a warp in the inductor component may be suppressed. Further, since the first and second vertical wiring lines are extended upward and downward from all of the first pad portion and the second pad portion of the inductor wiring line, it is possible to use the inductor component without distinguishing between the front and rear sides of the inductor component, and it is possible to omit a front-rear recognition process and an alignment process at the component manufacturing time, component mounting time, and the like.

Since the insulation layer is in contact with the first surface on one side of the inductor wiring line, it is possible to improve the insulating property. Furthermore, since there is no insulation layer on the other side of the inductor wiring line, it is possible to achieve excellent DC superposition characteristics and thin film formation, and as a result, it is possible to provide the inductor component excellent in reliability and characteristics.

Preferably, in an embodiment of the inductor component, the side surface of the inductor wiring line is formed in a tapered shape such that a width of the first surface of the inductor wiring line is larger than a width of a second surface on the opposite side to the first surface of the inductor wiring line, and the via conductor of the first vertical wiring line is connected to the first surface of the inductor wiring line.

In the present specification, the tapered shape refers to a shape in which the width of the inductor wiring line increases toward the first direction side or the second direction side.

According to the embodiment, since the side surface of the inductor wiring line is formed in a tapered shape, the filling property of the magnetic layer is improved when the magnetic layer is filled from the second surface side toward the first surface side of the inductor wiring line. Further, since the width of the first surface of the inductor wiring line is larger than the width of the second surface of the inductor wiring line, the width (area) of the via conductor of the first vertical wiring line to be connected to the first surface of the inductor wiring line may be increased, and the connection strength of the via conductor with the pad portion may be enhanced.

Preferably, in an embodiment of the inductor component, a central axis of the first vertical wiring line and a central axis of the second vertical wiring line are present on an identical axis.

The phrase "present on an identical axis" includes not only a case where the central axes completely overlap each other, but also a case where the central axes substantially overlap each other. Specifically, a case in which the central axes are shifted from each other by about 10% of the width of the first and second vertical wiring lines is taken as a variation in manufacturing, and the central axes are also considered to be present on the identical axis.

According to the embodiment, since the respective central axes of the first vertical wiring line and the second vertical wiring line are present on the identical axis, physical and electrical differences between the front and rear sides of the inductor component may be further reduced.

Preferably, in an embodiment of the inductor component, a cross-sectional area of the first vertical wiring line and a cross-sectional area of the second vertical wiring line are different from each other.

The cross-sectional area refers to an area of a cross section orthogonal to the direction in which the vertical wiring line extends.

According to the embodiment, it is possible to select the first and second vertical wiring lines to be connected in accordance with the density of a current that flows through the inductor wiring line. Accordingly, it is unnecessary to have a uniform cross-sectional area for the vertical wiring lines, so that the inductance of the inductor component may be improved for the same component outer shape by reducing the cross-sectional areas of some vertical wiring lines and by increasing the volume of the magnetic layer around the vertical wiring lines with the cross-sectional areas reduced.

Preferably, in an embodiment of the inductor component, the insulation layer is in contact with at least part of the side surface of the inductor wiring line.

According to the embodiment, it is possible to improve the insulating property between wiring lines of the inductor wiring line.

Preferably, in an embodiment of the inductor component, the insulation layer includes at least one of an epoxy-based resin, a phenol-based resin, a polyimide-based resin, an acrylic-based resin, and a vinyl ether-based resin.

According to the embodiment, an insulative organic resin is used in the insulation layer, thereby making it possible to enhance a close contact force between the inductor wiring line and the magnetic layer. Since the insulation layer becomes flexible in comparison with a case where an inorganic material is used for the insulation layer, it is possible to provide flexibility to the inductor component, and enhance mechanical strength, resistance against a thermal shock, and the like.

Preferably, in an embodiment of the inductor component, as for the first vertical wiring line and the second vertical wiring line, a minimum distance to the metal magnetic powder is equal to or less than about 200 nm.

According to the embodiment, since it is possible to increase the filling amount of the metal magnetic powder, the inductance of the inductor component may be increased.

Preferably, in an embodiment of the inductor component, as for a inductor wiring line, a minimum distance to the metal magnetic powder is equal to or less than about 200 nm.

According to the embodiment, since it is possible to increase the filling amount of the metal magnetic powder, the inductance may be increased.

Preferably, in an embodiment of the inductor component, the magnetic layer includes a principal surface that has irregularities and is parallel to the plane, and an arithmetic average roughness $R_a$ of the irregularities of the principal surface of the magnetic layer is about one tenth or less of a thickness T of the magnetic layer.

In the present specification, the arithmetic average roughness $R_a$ is calculated in accordance with Japanese Industrial Standards (JIS) B 0601-2001.

According to the embodiment, since the irregularities of the principal surface of the magnetic layer is small, stress is unlikely to be applied to surface irregularities of the inductor component when the inductor component is embedded, thereby making it possible to prevent the inductor component from being damaged.

Preferably, in an embodiment of the inductor component, the inductor component further includes a covering film provided on a surface of the magnetic layer.

According to the embodiment, when outside terminals are provided on the surface of the magnetic layer, the covering film may enhance the insulating property between the outside terminals. The covering film may hide scratches on the surface of the magnetic layer.

Preferably, in an embodiment of the inductor component, a plurality of the inductor wiring lines is laminated in the normal direction.

According to the embodiment, a mounting area may be reduced by laminating a plurality of inductor wiring lines in the normal direction. When the laminated inductor wiring lines are connected in series, it is possible to increase the inductance of the inductor component.

Preferably, in an embodiment of the inductor component, the inductor component further includes a plurality of interlayer via conductors configured to connect the inductor wiring lines of different layers in the normal direction, and, at least one central axis of the plurality of interlayer via conductors is on a different axis from the central axis of each of the first vertical wiring line and the second vertical wiring line.

According to the embodiment, since it is possible to suppress a recess when the interlayer via conductor is formed, the inductor component with stable quality may be provided.

Preferably, in an embodiment of the inductor component, the inductor wiring line includes a first inductor wiring line and a second inductor wiring line, and an average particle diameter of the metal magnetic powder is about one thirtieth or more and about one third or less (i.e., from about one thirtieth to about one third) of an inscribed circle of an inner magnetic path when viewed from the normal direction of the first inductor wiring line and the second inductor wiring line.

According to the embodiment, it is possible to increase obtainable magnetic permeability, and the inner magnetic path may be stably filled with the metal magnetic powder.

Preferably, in an embodiment of the inductor component, the inductor wiring line includes the first inductor wiring line and the second inductor wiring line, and the average particle diameter of the metal magnetic powder is about one thirtieth or more and about one third or less (i.e., from about one thirtieth to about one third) of a maximum distance between the first inductor wiring line and the second inductor wiring line.

According to the embodiment, it is possible to increase obtainable magnetic permeability, and stably fill the metal magnetic powder into between the first inductor wiring line and the second inductor wiring line.

Preferably, in an embodiment of the inductor component, the average particle diameter of the metal magnetic powder is about one tenth or more and about two-thirds or less (i.e., from about one tenth to about two-thirds) of the thickness T of the magnetic layer.

According to the embodiment, it is possible to increase obtainable magnetic permeability, and improve effective magnetic permeability.

Preferably, in an embodiment of the inductor component, the magnetic layer further contains ferrite powder.

According to the embodiment, since relative magnetic permeability of the ferrite powder is high, it is possible to improve the effective magnetic permeability, which is magnetic permeability per unit volume of the magnetic layer. In addition, the insulating property of the magnetic layer may be improved.

Preferably, in an embodiment of the inductor component, the magnetic layer contains non-magnetic powder made of an insulator.

According to the embodiment, the magnetic layer contains the non-magnetic powder made of an insulator such as a silica filler, thereby making it possible to improve the insulating property of the magnetic layer.

Preferably, an embodiment of a substrate with a built-in inductor component includes the above-discussed inductor component; a substrate in which the inductor component is embedded; and a substrate wiring line including a pattern portion extending in a direction along a principal surface of the substrate, and a substrate via portion extending in a thickness direction of the substrate, in which the substrate wiring line is connected to the inductor component at the substrate via portion.

According to the embodiment, the degree of freedom in circuit design may be enhanced.

Preferably, in an embodiment of the substrate with the built-in inductor component, the pattern portion of the substrate wiring line is disposed in parallel to the plane on which the inductor wiring line is disposed.

According to the embodiment, it is possible to thin the substrate with the built-in inductor component.

Other features, elements, characteristics and advantages of the present disclosure will become more apparent from the following detailed description of preferred embodiments of the present disclosure with reference to the attached drawings.

DETAILED DESCRIPTION

Hereinafter, inductor components as an aspect of the present disclosure will be described in detail with reference to the preferred embodiments illustrated. The attached drawings include some schematic drawings, and the actual dimensions and ratios may not be reflected therein in some cases.

First Embodiment

Structure

Figure 1A:
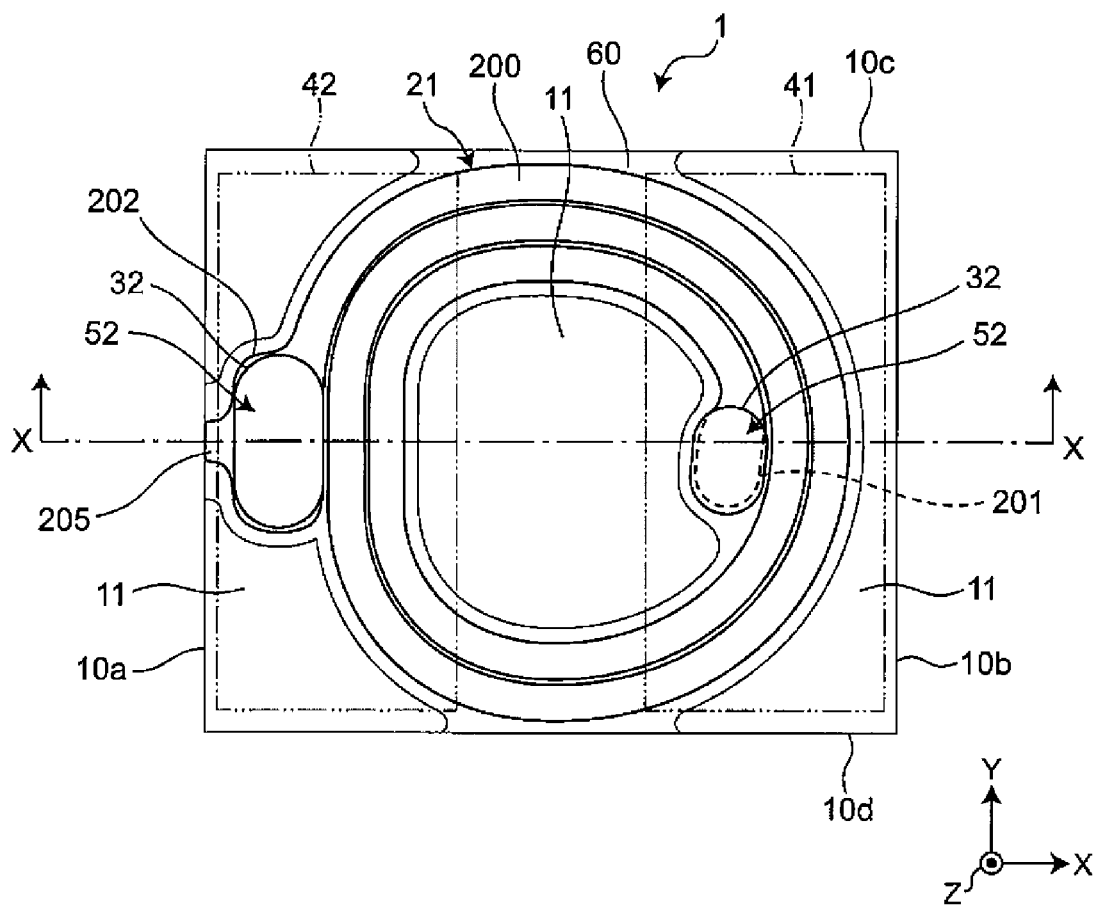
FIG. 1A is a perspective plan view illustrating an inductor component according to a first embodiment.
Figure 1B:
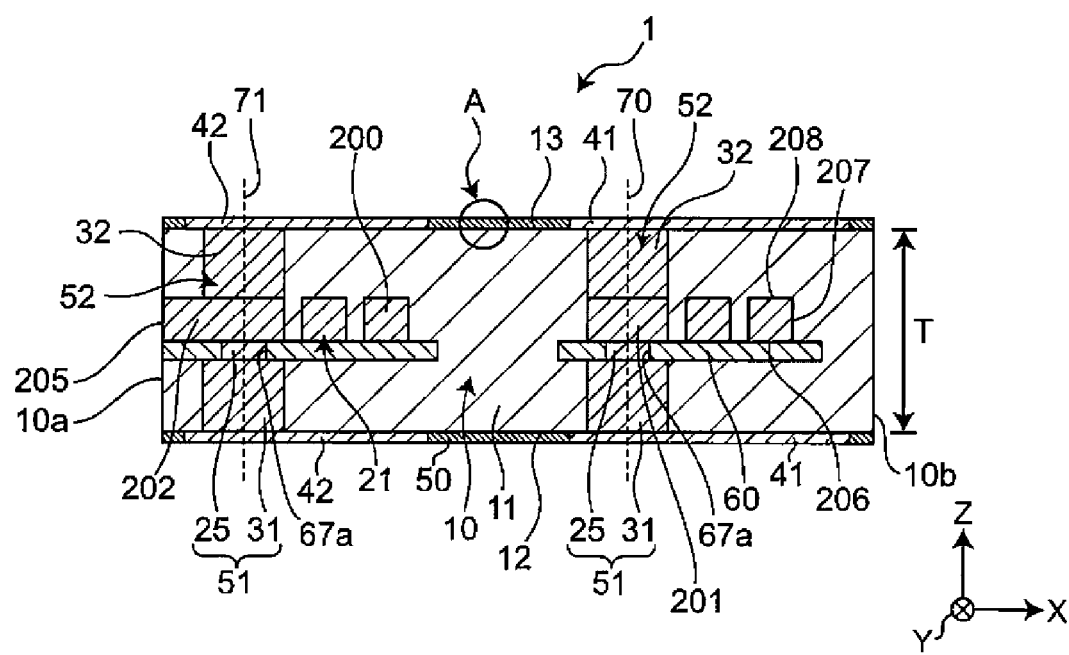
FIG. 1B is a cross-sectional view illustrating the inductor component according to the first embodiment.
Figure 1C:
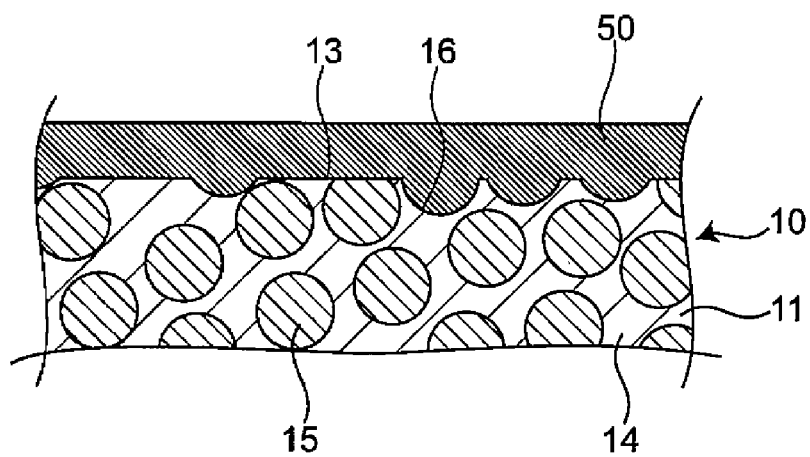
FIG. 1C is an enlarged view of a portion A in FIG. 1B.

FIG. 1A is a perspective plan view illustrating a first embodiment of an inductor component. FIG. 1B is a cross-sectional view taken along a line X-X in FIG. 1A. FIG. 1C is an enlarged view of a portion A in FIG. 1B. An inductor component 1 will be described with reference to FIGS. 1A, 1B, and 1C.

An outer surface of the inductor component 1 is configured of two principal surfaces opposing each other and formed by outer surfaces of outside terminals 41, 42 and a covering film 50, a first side surface 10a connected between the two principal surfaces, a second side surface 10b located on a side opposite to the first side surface 10a, a third side surface 10c connected between the two principal surfaces, and a fourth side surface 10d located on a side opposite to the third side surface 10c. As illustrated in the drawings, an X-direction is a direction in which the first side surface 10a and the second side surface 10b oppose each other. A Y-direction is a direction in which the third side surface 10c and the fourth side surface 10d oppose each other. A Z-direction is a direction in which the two principal surfaces oppose each other. The Z-direction is also a direction parallel to a thickness direction of the inductor component 1. A forward Z-direction is referred to as an upper side (second direction), and a reverse Z-direction is referred to as a lower side (first direction). The X-direction, the Y-direction, and the Z-direction are orthogonal to one another.

The inductor component 1 is a component formed in, for example, a substantially rectangular parallelepiped shape as a whole, and is mounted in, for example, an electronic apparatus such as a personal computer, a DVD player, a digital camera, a TV, a mobile phone, or car electronics. However, the shape of the inductor component 1 is not particularly limited, and may be a cylindrical shape, a polygonal columnar shape, a truncated cone shape, or a polygonal frustum shape.

The inductor component 1 includes a main body 10, an insulation layer 60, an inductor wiring line 21, vertical wiring lines 51 and 52, the outside terminals 41 and 42, and the covering film 50.

The inductor wiring line 21 is disposed on a plane in the main body 10. The inductor wiring line 21 is made of a conductive material, and is wound in a planar shape. That is, in this embodiment, the inductor wiring line 21 is a spiral wiring line. The spiral wiring line refers to a curved line (two-dimensional curved line) extending on a plane, and the number of turns drawn by the curved line may be more than one or may be less than one; the spiral wiring line may include a plurality of curved lines wound in different directions and may partially include a straight line.

The inductor wiring line 21 is spirally wound in the counterclockwise direction from a first pad portion 201, which is an inner circumference end of the end portions, toward a second pad portion 202, which is an outer circumference end of the end portions, when viewed from above. A normal direction with respect to the plane on which the inductor wiring line 21 is wound is parallel to the Z-direction. Each of the first pad portion 201 and the second pad portion 202 may not be a strict end, but may slightly enter into the inner side. Alternatively, each of them may have a protruding portion that does not head for the spirally wound portion to serve as a current path for electrolytic plating when the inductor component 1 is manufactured. In FIG. 1A, both the first pad portion 201 and the second pad portion 202 have a wider line width than the other sections of the inductor wiring line 21, but the present disclosure is not limited thereto.

The inductor wiring line 21 is made of a conductive material, for example, is made of a metal material with low electric resistance, such as Cu, Ag, Au, Fe, or an alloy containing these metals. DC resistance of the inductor wiring line 21 may be lowered.

The main body 10 has a flat-plate shape. The main body 10 has a first principal surface 12 located on the lower side, and a second principal surface 13 opposing the first principal surface 12 and located on the upper side. The main body 10 includes a magnetic layer 11. A first principal surface of the magnetic layer 11 corresponds to the first principal surface 12 of the main body 10, and a second principal surface of the magnetic layer 11 corresponds to the second principal surface 13 of the main body 10.

The magnetic layer 11 contains a resin 14 and metal magnetic powder 15 contained in the resin 14. The metal magnetic powder 15 may improve the DC superposition characteristics, and the resin 14 electrically insulates particles of the metal magnetic powder 15 from each other, thereby reducing loss (iron loss) at a high frequency.

The resin 14 preferably contains at least one of an epoxy-based resin and an acrylic-based resin. This makes it possible to improve the insulating property of the magnetic layer 11, and enhance the mechanical strength of the magnetic layer 11 by the stress relaxation effect by the resin 14. The resin 14 contains, for example, at least one of an epoxy-based resin, a polyimide-based resin, a phenol-based resin, and a vinyl ether-based resin.

The metal magnetic powder 15 preferably contains an Fe-based magnetic powder. This makes it possible to obtain excellent DC superposition characteristics. An example of the Fe-based magnetic powder includes an FeSi-based alloy such as FeSiCr, an FeCo-based alloy, an Fe-based alloy such as NiFe, or an amorphous alloy thereof. These Fe-based magnetic powder may be used alone or in combination.

The magnetic layer 11 preferably further contains a ferrite powder. With this, since the relative magnetic permeability of the ferrite powder is high, it is possible to improve the effective magnetic permeability, which is magnetic permeability per unit volume of the magnetic layer 11, and improve the insulating property of the magnetic layer 11. Examples of the ferrite powder include NiZn-based ferrite and MnZn-based ferrite. These ferrite powder may be used alone or in combination.

The magnetic layer 11 preferably contains non-magnetic powder made of an insulator. With this, since the magnetic layer 11 contains the non-magnetic powder made of an insulator such as a silica filler, it is possible to improve the insulating property of the magnetic layer. The main body 10 may further include, in addition to the magnetic layer 11, an insulator in a layered form.

The insulation layer 60 is embedded in the main body 10 (the magnetic layer 11). The insulation layer 60 is in contact with at least a first surface 206 of the first surface 206 on the first direction side and a side surface 207 of the inductor wiring line 21. When the insulation layer 60 makes contact with the first surface 206 of the inductor wiring line 21, it is possible to improve the insulating property between the inductor wiring line 21 and the constituent elements located on the first surface 206 side of the inductor wiring line 21 (such as the outside terminals 41 and 42, the wiring lines of the mounting substrate, and other components). Since the insulation layer 60 is not present on a second surface 208 on the second direction side, it is possible to obtain excellent DC superposition characteristics by increasing the volume of the magnetic layer 11 on the second surface 208 side by the amount of the volume thereof, and it is possible to achieve a reduction in thickness by decreasing the thickness of the magnetic layer 11 by the amount of the thickness thereof, whereby it is possible to provide the inductor component 1 excellent in reliability and characteristics.

The insulation layer 60 has a hole portion (an insulation layer cavity 67a) at a position corresponding to the first pad portion 201 of the inductor wiring line 21. A side surface of the insulation layer cavity 67a is parallel to the Z-direction. The insulation layer cavity 67a may be formed by, for example, laser processing. Although the side surface of the insulation layer cavity 67a is parallel to the Z-direction, the present disclosure is not limited thereto. The insulation layer cavity 67a may be slanted such that the width of the insulation layer cavity 67a increases along the first direction from the first surface 206 of each of the first and second pad portions 201 and 202. In other words, the insulation layer cavity 67a may have a tapered side surface.

The insulation layer 60 does not include a magnetic body, that is, it is a non-magnetic body including an insulative material. The insulative material is, for example, an insulative organic resin, and more specifically, it includes at least one of an epoxy-based resin, a phenol-based resin, a polyimide-based resin, an acrylic-based resin, and a vinyl ether-based resin. When the insulation layer 60 includes these insulative organic resins, the inductor wiring line 21 and the resin 14 included in the magnetic layer 11 are brought into close contact with each other through the above-mentioned resins of the insulation layer 60, and as a result, it is possible to improve the close contact force between the inductor wiring line 21 and the magnetic layer 11. Since the insulative organic resin of the insulation layer 60 makes the insulation layer 60 flexible in comparison with a case of an inorganic material, it is possible to provide flexibility to the inductor component 1, and enhance mechanical strength, resistance against a thermal shock, and the like. The insulation layer 60 may include a non-magnetic body filler such as silica, and in this case, it is possible to improve strength, workability, electric characteristics, and the like of the insulation layer 60.

The first vertical wiring line 51 extends from each of the first pad portion 201 and the second pad portion 202 of the inductor wiring line 21 in the first direction (the reverse Z-direction) to pass through the inside of the main body 10, and is exposed at the first principal surface 12 side of the main body 10. To be specific, the first vertical wiring line 51 includes a via conductor 25 extending from each of the first pad portion 201 and the second pad portion 202 of the inductor wiring line 21 toward the first direction side to pass through the inside of the insulation layer 60, and a first columnar wiring line 31 extending from the via conductor 25 toward the first direction side to pass through the inside of the magnetic layer 11. The via conductor 25 of the first vertical wiring line 51 is connected to the first surfaces 206 of the inductor wiring line 21 (more specifically, to the first surface 206 of each of the first and second pad portions 201 and 202 of the inductor wiring line 21).

The second vertical wiring line 52 extends from each of the first pad portion 201 and the second pad portion 202 of the inductor wiring line 21 in the second direction (the forward Z-direction) to pass through the inside of the main body 10, and is exposed at the second principal surface 13 side of the main body 10. To be specific, the second vertical wiring line 52 includes a second columnar wiring line 32 extending from each of the first pad portion 201 and the second pad portion 202 of the inductor wiring line 21 toward the second direction side to pass through the inside of the magnetic layer 11.

The outside terminals 41 and 42 are electrically connected to the inductor wiring line 21, and are exposed from the first and second principal surfaces 12 and 13 of the main body 10. The outside terminal 41 and 42 cover part of the first and second principal surfaces 12 and 13 of the main body 10, and are electrically connected to the inductor wiring line 21 via the vertical wiring lines 51 and 52. The outside terminals 41 and 42 are formed of a conductive material. The conductive material is, for example, at least one of Cu, Ni and Au, or an alloy thereof. The outside terminals 41 and 42 may be a multi-layer metal film in which a plurality of metal films is laminated. The multi-layer metal film is constituted of three metal layers in which, for example, a layer of Cu having low electric resistance and excellent in stress resistance, a layer of Ni excellent in corrosion resistance, and a layer of Au excellent in wettability and reliability are laminated in that order from an inner side portion toward an outer side portion of the outside terminals 41 and 42.

The first outside terminal 41 is provided on each of the first principal surface 12 and the second principal surface 13 of the main body 10. On the first principal surface 12, the first outside terminal 41 is connected to the first vertical wiring line 51 connected to the first pad portion 201 of the first inductor wiring line 21. The first outside terminal 41 covers an end surface of the first vertical wiring line 51 (the first columnar wiring line 31) exposed from the first principal surface 12 of the main body 10. On the second principal surface 13, the first outside terminal 41 is connected to the second vertical wiring line 52 connected to the first pad portion 201 of the first inductor wiring line 21.

The second outside terminal 42 is provided on each of the first principal surface 12 and the second principal surface 13 of the main body 10. On the second principal surface 13, the second outside terminal 42 is connected to the second vertical wiring line 52 connected to the second pad portion 202 of the first inductor wiring line 21. The second outside terminal 42 covers the end surface of the first vertical wiring line 51 (the first columnar wiring line 31) exposed from the first principal surface 12 of the main body 10. On the second principal surface 13, the second outside terminal 42 is connected to the second vertical wiring line 52 connected to the second pad portion 202 of the first inductor wiring line 21.

The covering film 50 is provided on the surface of the magnetic layer 11. The covering film 50 covers part of the first and second principal surfaces 12 and 13 of the main body 10, and exposes the end surfaces of the outside terminals 41 and 42. With this, the covering film 50 may improve the insulating property between the outside terminals 41 and 42 (specifically, between the first outside terminals 41 and 41 adjacent to each other and between the second outside terminals 42 and 42 adjacent to each other). In addition, the covering film 50 may hide scratches on the first and second principal surfaces 12 and 13 of the main body 10. The covering film 50 does not contain a magnetic body, that is, it is a non-magnetic body and is made of, for example, the insulative material exemplified as a material of the insulation layer 60.

According to the inductor component 1 discussed above, since the first and second vertical wiring lines 51 and 52 are extended in the first direction and the second direction with respect to the inductor wiring line 21, the degree of freedom in connection with the wiring line of the mounting substrate is enhanced. In the inductor component 1, for example, wiring connection to an input terminal may be carried out only from the upper side, and wiring connection to an output terminal may be carried out only from the lower side. Since the first and second vertical wiring lines 51 and 52 are extended in the first direction and the second direction with respect to the inductor wiring line 21, the upper and lower stresses may be approximated to each other with respect to the inductor wiring line 21 of the inductor component 1, so that a warp in the inductor component 1 may be suppressed. Further, since the first and second vertical wiring lines 51 and 52 are extended upward and downward in the inductor component 1 from all of the first pad portion 201 and the second pad portion 202 of the inductor wiring line 21, it is possible to use the inductor component 1 without distinguishing between the front and rear sides of the inductor component 1, and it is possible to omit a front-rear recognition process and an alignment process at the component manufacturing time, component mounting time, and the like.

Preferably, first central axes 70 of the first vertical wiring line 51 and the second vertical wiring line 52 are present on an identical axis. To be specific, the central axis of the first columnar wiring line 31 and the via conductor 25 of the first vertical wiring line 51 and the central axis of the second columnar wiring line 32 of the second vertical wiring line 52 are present on the identical axis.

Accordingly, since the paired central axes of the first vertical wiring line 51 and second vertical wiring lines 52 are present on the identical axis, physical and electrical differences between the front and rear sides of the inductor component 1 may be reduced. In contrast, when the central axes are shifted from each other, there is a difference between the front and rear sides of the inductor component. When the above difference exists, in a case where the inductor component is particularly desired to be used with high accuracy, or the like, it is necessary to confirm the front and rear sides of the inductor component at the mounting time thereof. In a case where paths of a current flowing to the inductor wiring line differs between the front and rear sides due to the shift of the connection positions of the vertical wiring lines, the effective Rdc and the inductance are also slightly different between the front and rear sides.

Preferably, as for the first vertical wiring line 51 and the second vertical wiring line 52, a minimum distance to the metal magnetic powder 15 is equal to or less than about 200 nm. Accordingly, since it is possible to increase the filling amount of the metal magnetic powder 15 in the magnetic layer 11, the inductance of the inductor component 1 may be increased. For the measurement of the minimum distance, a scanning electron microscope (SEM) image of a cross section passing through the central axis of the first vertical wiring line 51 is used. That is, by using the SEM image, the distance between the first vertical wiring line 51 and the metal magnetic powder 15 in the vicinity thereof is measured, and the minimum distance among a plurality of distances obtained is defined as the minimum distance. The same applies to the second vertical wiring line 52. The magnification of the SEM image for measuring the distance is set to about 10000, or set to a value at which approximately 30 particles of the metal magnetic powder 15 are included.

Preferably, the minimum distance between the inductor wiring line 21 and the metal magnetic powder 15 is about 200 nm or less. Accordingly, since it is possible to increase the filling amount of the metal magnetic powder 15 in the magnetic layer 11, the inductance of the inductor component 1 may be increased. For the measurement of the minimum distance, an SEM image of a cross section passing through the central axis of the inductor wiring line 21 is used. That is, by using the SEM image, the distance between the inductor wiring line 21 and the metal magnetic powder 15 in the vicinity thereof is measured, and the minimum distance among a plurality of distances obtained is defined as the minimum distance. The magnification of the SEM image for measuring the distance is set to about 10000, or set to a value at which approximately 30 particles of the metal magnetic powder 15 are included.

Preferably, the principal surfaces of the magnetic layer 11 (the first and second principal surfaces 12 and 13 of the main body 10) have irregularities. The principal surfaces of the magnetic layer 11 are parallel to the plane on which the inductor wiring line 21 is disposed. The irregularities are formed by shedding part of the metal magnetic powder 15 from the first and second principal surfaces 12 and 13. The irregularities are mainly constituted by the flatness of the resin 14 portion and by a recess 16 formed by the shedding of the metal magnetic powder 15. In the principal surfaces 12 and 13 of the main body 10 of the present embodiment, the recess 16 formed by the shedding of the metal magnetic powder 15 is dominant in an arithmetic average roughness $R_a$ to be described later. Since the layers making contact with the principal surfaces 12 and 13 (for example, the covering film 50 and the first and second outside terminals 41, 42) enter into the recess 16, a close contact property between the principal surfaces 12, 13 of the main body 10 and the layers making contact with the principal surfaces 12, 13 is improved due to the anchor effect.

It is preferable that the arithmetic average roughness $R_a$ of the irregularities of the principal surface of the magnetic layer 11 be about one tenth or less of a thickness T of the magnetic layer 11. As described above, when the arithmetic average roughness $R_a$ is about one tenth or less of the thickness T of the magnetic layer 11, since the irregularities of the principal surface of the magnetic layer 11 is small, stress is unlikely to be applied to the surface irregularities of the inductor component 1 at the time of embedding the inductor component 1, thereby making it possible to prevent the inductor component 1 from being damaged.

The arithmetic average roughness $R_a$ is an arithmetic average roughness of a section of a straight line on the first principal surface 12 of the main body 10 passing through the first outside terminal 41 and the second outside terminal 42; the section of the straight line refers to a portion of the straight line in which part of the straight line overlapping with the first outside terminal 41 is excluded. In the present embodiment, the straight line is a straight line on the first principal surface 12 drawn in such a manner as to pass through the first outside terminal 41 and the second outside terminal 42, and refers to a straight line on the first principal surface 12 at a position indicated by an X-X cross-sectional line in FIG. 1A, for example. The arithmetic average roughness $R_a$ can be measured by using a shape analysis laser microscope ("Shape Measurement Laser Microscope VK-X100" manufactured by Keyence Corporation). Specifically, the covering film 50 of the inductor component 1 is peeled off, and the first principal surface 12 of the main body 10 is exposed. On the exposed first principal surface 12, the arithmetic average roughness $R_a$ of a portion including the straight line on the first principal surface 12 passing through the outside terminals 41 and 42 is measured at about 50-fold magnification. The same applies to the second principal surface 13.

The thickness T of the magnetic layer 11 is a thickness in the Z-direction of the magnetic layer 11. The thickness T is measured by using a scanning electron microscope. Specifically, the inductor component 1 is cut in the Z-direction at a straight line on the first principal surface 12 drawn in such a manner as to pass through the first outside terminal 41 and the second outside terminal 42, and then an SEM image is obtained from a cross section of the measurement sample by using a scanning electron microscope. The thickness T is measured by using the SEM image.

It is sufficient that, in at least one of the first and second principal surfaces 12 and 13, $R_a$ satisfies a relation of being equal to or less than about T/10. In a case where a plurality of magnetic layers 11 is present, the thickness T of the magnetic layer refers to the sum total of the thicknesses of the plurality of magnetic layers.

An average particle diameter of the metal magnetic powder 15 is, for example, about 0.1 µm or more and about 50 µm or less (i.e., from about 0.1 µm to about 50 µm), preferably is about 1 µm or more and 30 µm or less (i.e., from about 1 µm to 30 µm), and more preferably is about 2 µm or more and 5 µm or less (i.e., from about 2 µm to 5 µm). The average particle diameter of the metal magnetic powder 15 may be calculated as a particle diameter (a volume median diameter $D_{50}$) equivalent to an integrated value of 50% in the particle size distribution obtained by a laser diffraction/scattering method in a raw material state in which the metal magnetic powder 15 is contained in the resin 14. In a finished product state of the inductor component 1, the average particle diameter of the metal magnetic powder 15 is measured by using an SEM image of a cross section passing through a straight line on the first and second principal surfaces 12 and 13 of the main body 10. Specifically, in an SEM image at a magnification at which 15 or more particles of the metal magnetic powder 15 can be confirmed, the area of each particle of the metal magnetic powder 15 is measured to calculate the diameter thereof from an equivalent circle diameter, and then the arithmetic average value thereof is taken as the average particle diameter of the metal magnetic powder 15.

Preferably, the average particle diameter of the metal magnetic powder 15 is about one tenth or more and two-thirds or less (i.e., from about one tenth to two-thirds) of the thickness T of the magnetic layer 11. With this, since the average particle diameter of the metal magnetic powder 15 is about one tenth or more, the average particle diameter of the metal magnetic powder 15 does not become smaller than necessary with respect to the magnetic layer 11, and the magnetic permeability obtainable by the inductor component 1 may be made large. Further, since the average particle diameter of the metal magnetic powder 15 is two-thirds or less, it is possible to decrease the shedding amount of the magnetic metal powder 15 during the grinding of the magnetic layer 11, and improve the effective magnetic permeability.

Manufacturing Method

Next, a method of manufacturing the inductor component 1 will be described.

Figure 2A:
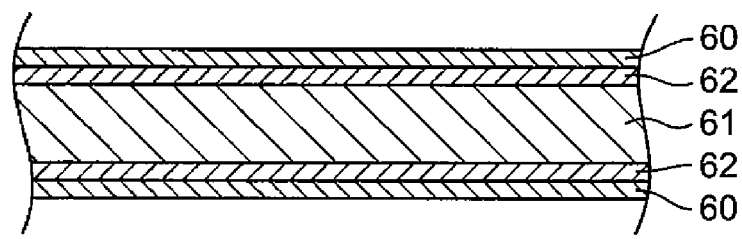
FIG. 2A is an explanatory diagram explaining a manufacturing method for an inductor component according to the first embodiment.

As illustrated in FIG. 2A, a dummy core substrate 61 is prepared. The dummy core substrate 61 has a substrate copper foil on both sides thereof. In the present embodiment, the dummy core substrate 61 is a glass epoxy substrate. The thickness of the dummy core substrate 61 does not affect the thickness of the inductor component 1. Therefore, a substrate such that a thickness and a material thereof are easily dealt with may be appropriately used in consideration of a warp or the like during the process.

Next, a copper foil (dummy metal layer) 62 is adhered onto a surface of the substrate copper foil. The copper foil 62 is adhered to a smooth surface of the substrate copper foil. Therefore, it is possible to weaken the adhesion between the copper foil 62 and the substrate copper foil, and it is possible to easily peel off the dummy core substrate 61 from the copper foil 62 in a process to be carried out later. Preferably, the adhesive for bonding the dummy core substrate 61 and the copper foil 62 is a low adhesive compound. In order to weaken the adhesion between the dummy core substrate 61 and the copper foil 62, it is desirable that the bonding surface of the dummy core substrate 61 and the copper foil 62 be a glossy surface.

Thereafter, the insulation layer 60 is laminated on the copper foil 62. At this time, the insulation layer 60 is thermally pressure-bonded and thermally cured by a vacuum laminating machine, a pressing machine, or the like.

Figure 2B:
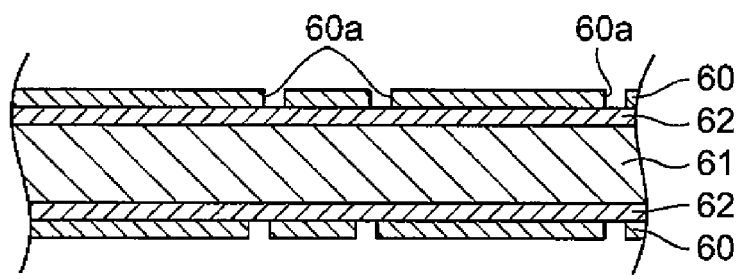
FIG. 2B is an explanatory diagram explaining a manufacturing method for the inductor component according to the first embodiment.
Figure 2C:
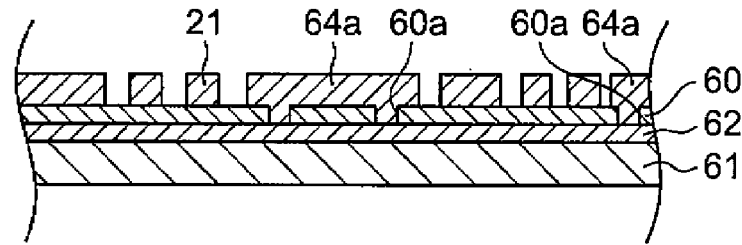
FIG. 2C is an explanatory diagram explaining a manufacturing method for the inductor component according to the first embodiment.

As illustrated in FIG. 2B, laser processing or the like is carried out on the insulation layer 60 to form cavities 60a. Then, as illustrated in FIG. 2C, dummy copper 64a and the inductor wiring line 21 are formed on the insulation layer 60. Specifically, a power supply film (not illustrated) for a SAP is formed on the insulation layer 60 by electroless plating, sputtering, vapor deposition, or the like. After the power supply film is formed, a photosensitive resist is applied or attached to the power supply film, and a cavity of the photosensitive resist is formed in a portion where the wiring pattern is to be formed by photolithography. Thereafter, a metal wiring line corresponding to the dummy copper 64a and the inductor wiring line 21 is formed in the cavity of the photosensitive resist layer. After the metal wiring line is formed, the photosensitive resist is peeled and removed by a chemical solution, and the power supply film is removed by etching. Then, while using the metal wiring line as a power supply section, additional copper electrolytic plating is carried out to obtain a wiring line in a narrow space. The cavities 60a formed as in FIG. 2B are filled with copper by the SAP.

Thereafter, the dummy core substrate 61 is peeled off from the copper foil 62. Then, the copper foil 62 is removed by etching or the like, the dummy copper 64a is also removed by etching or the like, and as illustrated in FIG. 2D, a hole portion 66a corresponding to an inner magnetic path and a hole portion 66b corresponding to an outer magnetic path are formed.

Figure 2D:
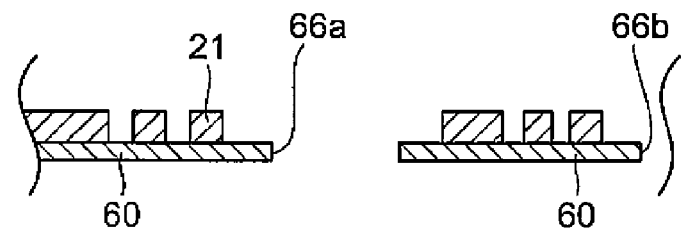
FIG. 2D is an explanatory diagram explaining a manufacturing method for the inductor component according to the first embodiment.
Figure 2E:
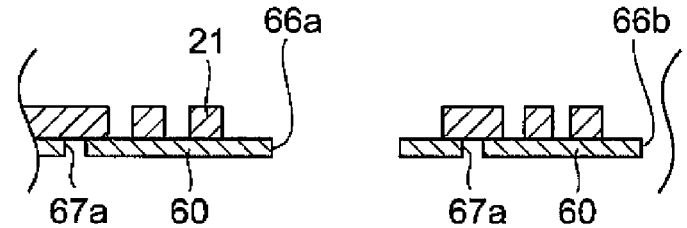
FIG. 2E is an explanatory diagram explaining a manufacturing method for the inductor component according to the first embodiment.
Figure 2F:
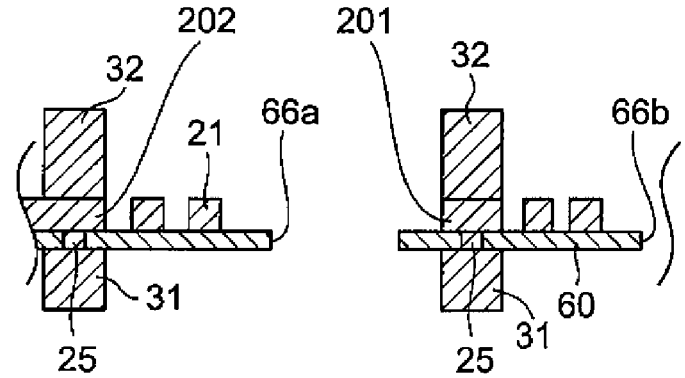
FIG. 2F is an explanatory diagram explaining a manufacturing method for the inductor component according to the first embodiment.

Thereafter, as illustrated in FIG. 2E, an insulation layer cavity 67a is formed by laser processing or the like. Then, as illustrated in FIG. 2F, the insulation layer cavity 67a is filled with copper by the SAP to form the via conductor 25, and the via conductor 25 is formed in the insulation layer 60 and the columnar wiring lines 31 and 32 are formed on the pad portions 201 and 202. In the laser processing, laser light is radiated, from the first direction side toward the second direction side, to the insulation layer 60 illustrated in FIG. 2D. When the laser light is radiated to the insulation layer 60 along the forward Z-direction, the insulation layer cavity 67a having a side surface parallel to the Z-direction is formed.

In the laser processing, when the laser light is condensed and radiated, from the first direction side toward the second direction side, to the insulation layer 60 illustrated in FIG. 2D, the insulation layer cavity 67a having a tapered side surface in which the width of the cavity decreases along the second direction is formed. The insulation layer cavity 67a may be formed by using a photolithography method and an etching method instead of the laser processing.

Figure 2G:
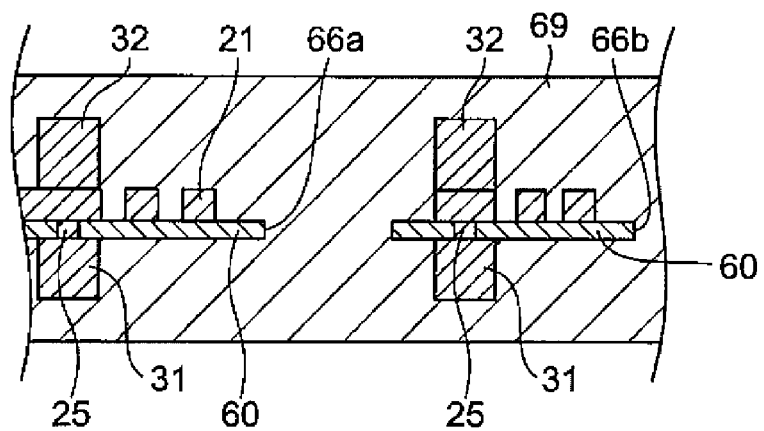
FIG. 2G is an explanatory diagram explaining a manufacturing method for the inductor component according to the first embodiment.

Next, as illustrated in FIG. 2G, an inductor substrate is formed by covering the inductor wiring line 21, the insulation layer 60, and the columnar wiring lines 31 and 32 with a magnetic material 69 (the magnetic layer 11). The magnetic material 69 is thermally pressure-bonded and thermally cured by a vacuum laminating machine, a pressing machine, or the like. At this time, the magnetic material 69 is also filled into the hole portions 66a and 66b.

Figure 2H:
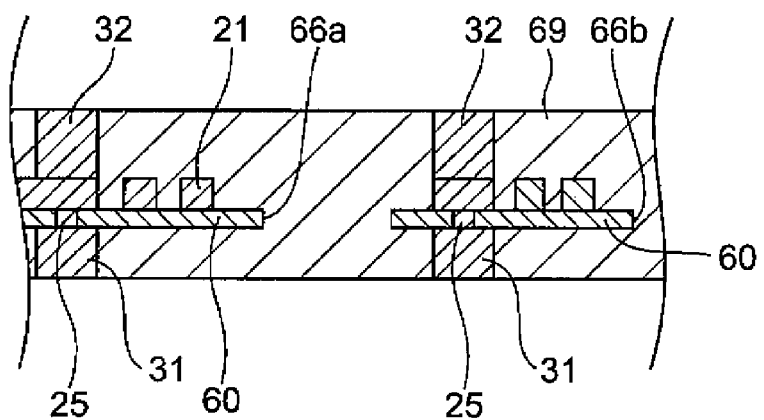
FIG. 2H is an explanatory diagram explaining a manufacturing method for the inductor component according to the first embodiment.

Then, as illustrated in FIG. 2H, the magnetic material 69 on the upper side and the lower side in the inductor substrate is thinned by a grinding technique. At this time, by exposing part of the columnar wiring lines 31 and 32, exposed portions of the columnar wiring lines 31 and 32 are formed on the same plane of the magnetic material 69. At this time, it is possible to reduce the thickness of the inductor component 1 by grinding the magnetic material 69 to a thickness sufficient to obtain the inductance value.

Figure 2I:
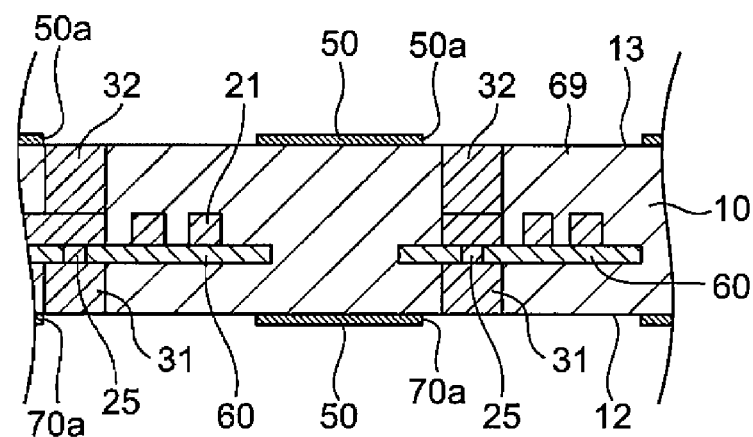
FIG. 2I is an explanatory diagram explaining a manufacturing method for the inductor component according to the first embodiment.

Thereafter, as illustrated in FIG. 2I, the covering film 50 is formed on the first and second principal surfaces 12 and 13 of the main body 10 by a printing technique. A cavity 50a of the covering film 50 is defined as a formation section of each of the outside terminals 41 and 42. In the present embodiment, the printing technique is used, but the cavity 50a may be formed by the photolithography method.

Figure 2J:
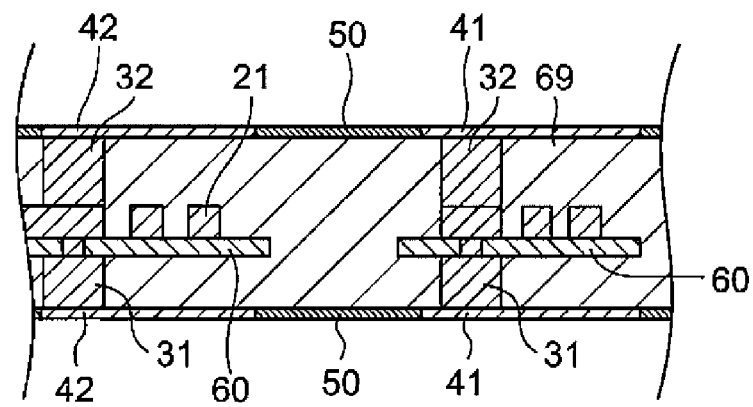
FIG. 2J is an explanatory diagram explaining a manufacturing method for the inductor component according to the first embodiment.
Figure 2K:
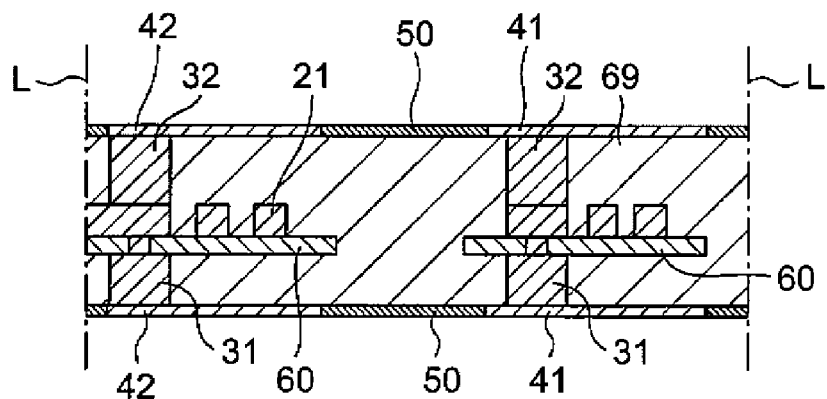
FIG. 2K is an explanatory diagram explaining a manufacturing method for the inductor component according to the first embodiment.

Next, as illustrated in FIG. 2J, the outside terminals 41 and 42 are formed by, for example, electroless copper plating or plated covering of Ni, Au and the like, and as illustrated in FIG. 2K, singulation is performed by cutting with a dicing machine at a broken line portion L, whereby the inductor component 1 illustrated in FIGS. 1A and 1B is achieved. Although the description is omitted in FIG. 2B and subsequent figures, an inductor substrate may be formed on both surfaces of the dummy core substrate 61. As a result, high productivity may be obtained.

Second Embodiment

Figure 3:
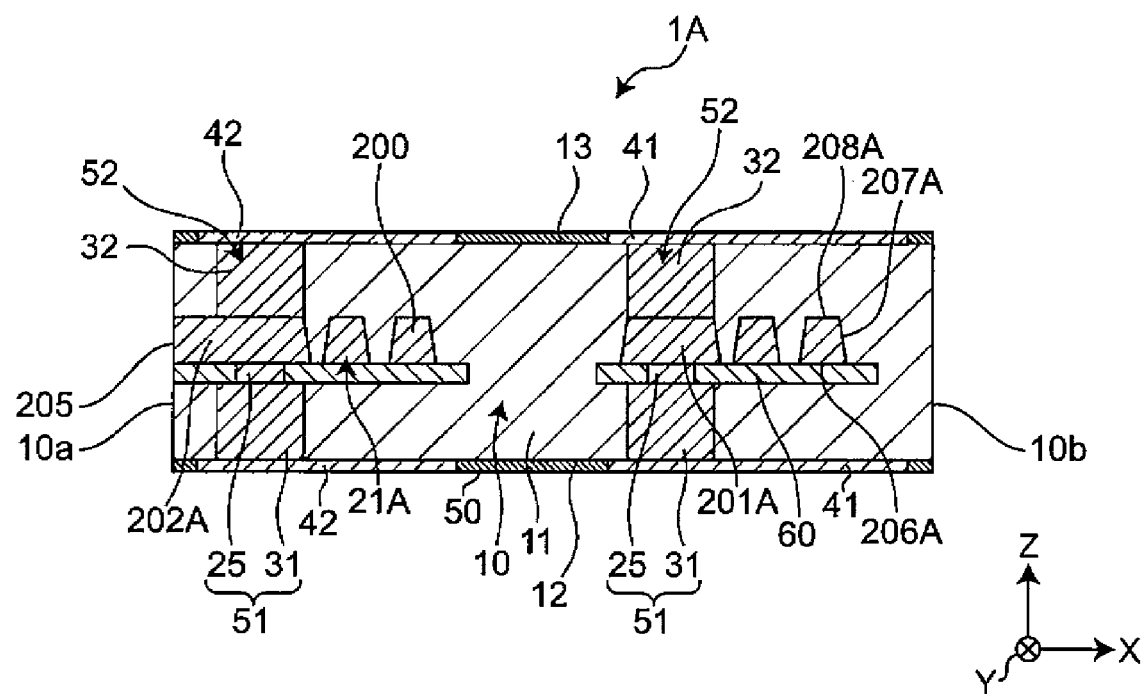
FIG. 3 is a cross-sectional view illustrating an inductor component according to a second embodiment.

FIG. 3 is a cross-sectional view illustrating a second embodiment of an inductor component. The cross-sectional shape of an inductor wiring line in the second embodiment is different from that in the first embodiment. This different configuration will be described below. In the second embodiment, the same reference symbols as those in the first embodiment denote the same constituent elements as those in the first embodiment, and therefore, description thereof will be omitted.

As illustrated in FIG. 3, in an inductor component 1A of the second embodiment, the cross section of an inductor wiring line 21A has a trapezoidal shape in which a second surface 208A serves as an upper base, a first surface 206A serves as a lower base, and a side surface 207A serves as a leg. As described above, the side surface 207A is formed in a tapered shape in which the width of the first surface 206A is larger than the width of the second surface 208A on the opposite side to the first surface 206A.

The tapered shape is a shape such that the width of the inductor wiring line 21A increases from the second direction side toward the first direction side (along the reverse Z-direction). Accordingly, the tapered shape is not limited to a trapezoidal shape in which the side surface 207A is slanted in such a manner that the width of the cross section of the inductor wiring line 21A, as illustrated in FIG. 3, increases from the second surface 208A toward the first surface 206A. For example, the tapered shape may be a shape in which the side surface takes a curved surface, the side surface partially includes a curved surface therein, or the side surface partially includes irregularities therein. In addition, the tapered shape is not limited to a strict tapered shape, and includes a substantially tapered shape in consideration of a practical variation range.

Since the side surface 207A of the inductor wiring line 21A is formed in a tapered shape, the filling property of a magnetic layer 11 is improved when the magnetic layer 11 is filled from the second surface 208A side of the inductor wiring line 21A toward the first surface 206A side thereof. Further, since the width of the first surface 206A is larger than the width of the second surface 208A, the width (area) of a via conductor 25 to be connected to the first surface 206A may be increased, and the connection strength of the via conductor 25 with pad portion 201A and 202A may be enhanced.

Third Embodiment

Figure 4:
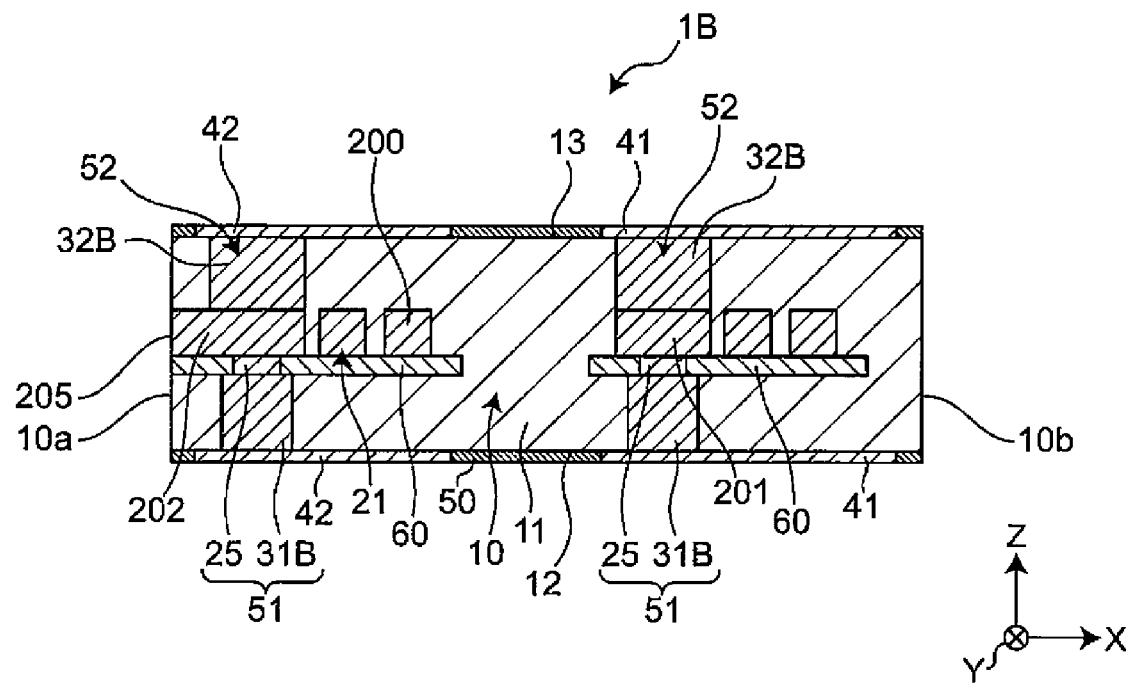
FIG. 4 is a cross-sectional view illustrating an inductor component according to a third embodiment.

FIG. 4 is a cross-sectional view illustrating a third embodiment of an inductor component. The third embodiment differs from the first embodiment in that the cross-sectional area of a first vertical wiring line and the cross-sectional area of a second vertical wiring line are different from those of the first embodiment. This different configuration will be described below. In the third embodiment, the same reference symbols as those in the first embodiment denote the same constituent elements as those in the first embodiment, and therefore, description thereof will be omitted.

As illustrated in FIG. 4, in the inductor component 1B of the third embodiment, as for a first vertical wiring line 51 and a second vertical wiring line 52 connected at the same location, the cross-sectional areas of the first vertical wiring line 51 and the second vertical wiring line 52 are different from each other. More specifically, for example, the cross-sectional area of a first columnar wiring line 31B is smaller than that of a second columnar wiring line 32B. The cross-sectional areas of the first and second vertical wiring lines 51 and 52 are the areas of the vertical wiring lines 51 and 52 at the cross sections thereof orthogonal to the direction (Z-direction) in which the vertical wiring lines 51 and 52 extend.

When the cross-sectional areas of the first vertical wiring line 51 and the second vertical wiring line 52 are different from each other, it is possible to select the first and second vertical wiring lines 51 and 52 to be connected in accordance with the density of a current flowing through an inductor wiring line 21. Accordingly, it is unnecessary to have a uniform cross-sectional area for each of the vertical wiring lines 51 and 52, so that the inductance may be improved for the same outer shape of the inductor component 1 by making the cross section of the first vertical wiring line 51 smaller than that of the second vertical wiring line 52 and by increasing the volume of a magnetic layer 11 around the first vertical wiring line 51.

The cross-sectional area of the second vertical wiring line 52 may be smaller than the cross-sectional area of the first vertical wiring line 51, and in this case, by increasing the volume of the magnetic layer 11 around the second vertical wiring line 52, it is possible to improve the inductance for the same outer shape of the inductor component 1. Further, it is sufficient that, in at least one pair among a plurality of pairs of the first vertical wiring line 51 and the second vertical wiring line 52 connected at the same location, the cross-sectional areas of the first vertical wiring line 51 and the second vertical wiring line 52 are different from each other.

Fourth Embodiment

Figure 5A:
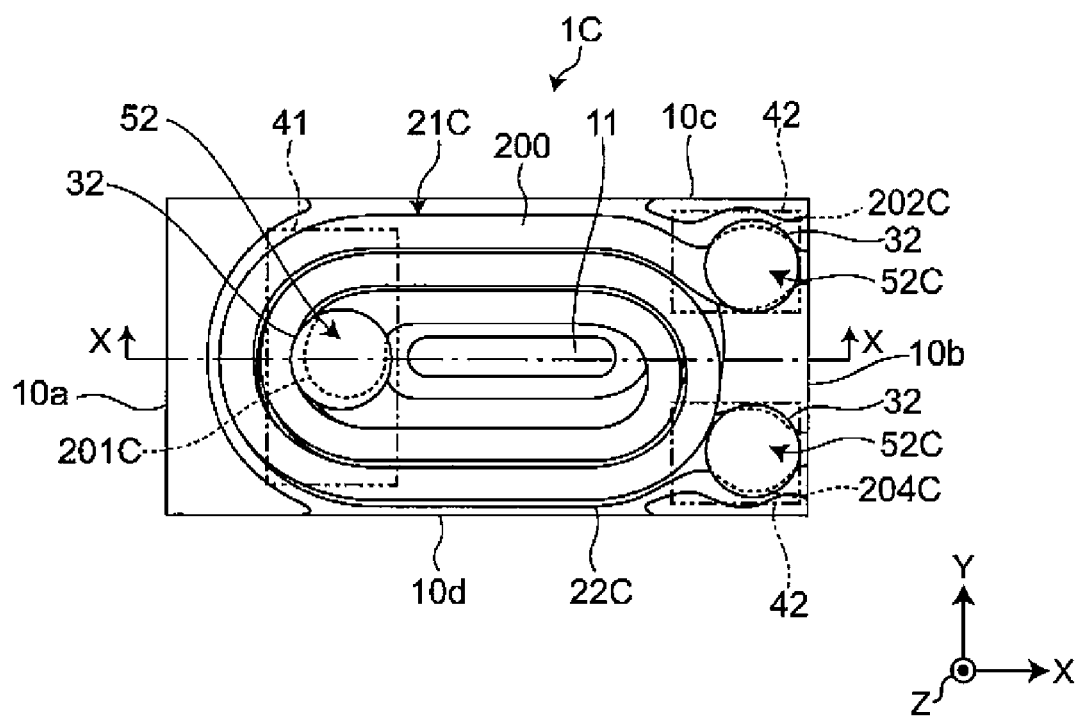
FIG. 5A is a perspective plan view illustrating an inductor component according to a fourth embodiment.
Figure 5B:
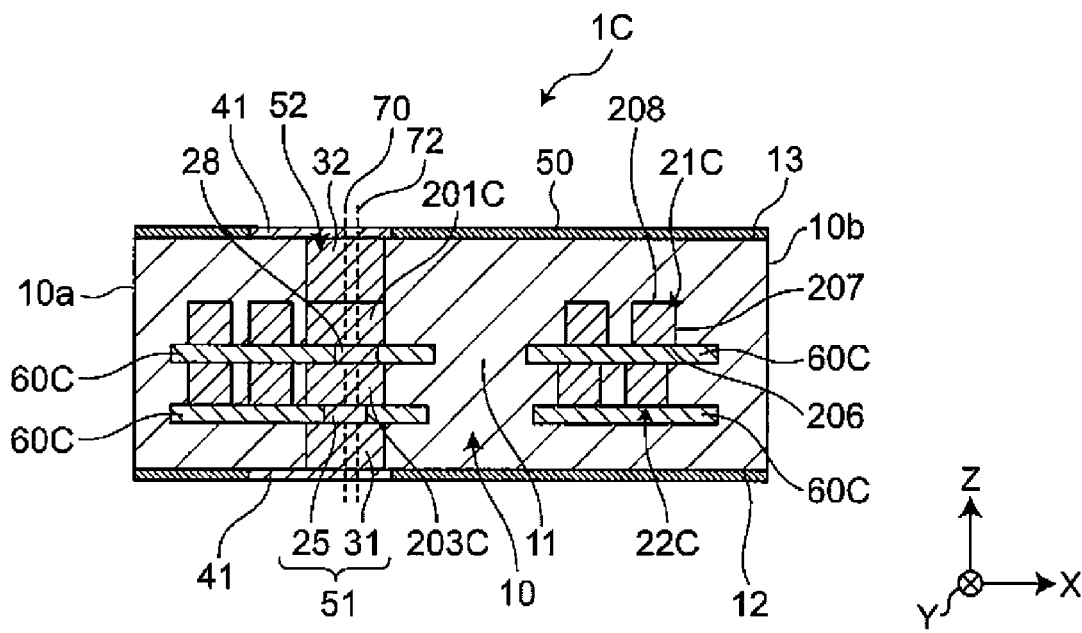
FIG. 5B is a cross-sectional view illustrating an inductor component according to the fourth embodiment.

FIG. 5A is a perspective plan view illustrating a fourth embodiment of an inductor component. FIG. 5B is a cross-sectional view (a cross-sectional view taken along a line X-X in FIG. 5A) of an inductor component according to the fourth embodiment. The fourth embodiment is different from the first embodiment in that an inductor wiring line configuration (more specifically, the shape and the number of inductor wiring lines) differs, and that an interlayer via conductor is further provided. This different configuration will be described below. In the fourth embodiment, the same reference symbols as those in the first embodiment denote the same constituent elements as those in the first embodiment, and therefore, description thereof will be omitted.

As illustrated in FIGS. 5A and 5B, in an inductor component 1C of the fourth embodiment, a plurality of inductor wiring lines is laminated in the normal direction (Z-direction) of a first inductor wiring line 21C and a second inductor wiring line 22C in comparison with the first embodiment. Accordingly, by laminating the plurality of inductor wiring lines in the normal direction, it is possible to remove the influence on the mounting area.

To be specific, the first inductor wiring line 21C is laminated in the normal direction of the second inductor wiring line 22C, and the first inductor wiring line 21C and the second inductor wiring line 22C are connected in series. That is, the inductor component 1C includes an interlayer via conductor 28 configured to connect the inductor wiring lines 21C and 22C of different layers in the normal direction. The first inductor wiring line 21C and the second inductor wiring 22C are connected in series via the interlayer via conductor (second via conductor) 28. When the inductor wiring lines 21C and 22C laminated in this manner are connected in series, it is possible to increase the inductance of the inductor component 1C.

A first pad portion 201C of the first inductor wiring line 21C is electrically connected to a first outside terminal 41 on the side of a second principal surface 13 via a second vertical wiring line 52 on the upper side of the first pad portion 201C. A second pad portion 202C of the first inductor wiring line 21C is electrically connected to a second outside terminal 42 on the second principal surface 13 side via the second vertical wiring line 52 on the upper side of the second pad portion 202C, and is electrically connected to the second outside terminal 42 on the side of a first principal surface 12 via a first vertical wiring line 51 on the lower side of the second pad portion 202C.

The second inductor wiring line 22C is disposed on the bottom side of the first inductor wiring line 21C. A first pad portion 203C of the second inductor wiring line 22C is electrically connected to the first outside terminal 41 on the first principal surface 12 side via the first vertical wiring line 51 on the lower side of the first pad portion 203C. A second pad portion 204C of the second inductor wiring line 22C is electrically connected to the second outside terminal 42 on the first principal surface 12 side via the first vertical wiring line 51 on the lower side of the second pad portion 204C, and is electrically connected to the second outside terminal 42 on the second principal surface 13 side via the second vertical wiring line 52 on the upper side of the second pad portion 204C.

The first pad portion 201C of the first inductor wiring line 21C and the first pad portion 203C of the second inductor wiring 22C are electrically connected via the interlayer via conductor 28. With this, the first pad portion 201C of the first inductor wiring line 21C is electrically connected to the first outside terminal 41 on the first principal surface 12 side via the first vertical wiring line 51 on the lower side of the first pad portion 201C. Likewise, the first pad portion 203C of the second inductor wiring line 22C is electrically connected to the first outside terminal 41 on the second principal surface 13 side via the second vertical wiring line 52 on the upper side of the first pad portion 203C.

A third central axis 72 of the interlayer via conductor 28 is different from a first central axis 70 of each of the first vertical wiring line 51 and the second vertical wiring line 52. This makes it possible to suppress a recess when forming the interlayer via conductor 28, and thus it is possible to provide the inductor component 1C with stable quality.

The inductor wiring lines 21C and 22C substantially have a track shape formed of semicircular portions and straight-line portions. The first inductor wiring line 21C is spirally wound in the clockwise direction from the first pad portion 201C, which is an inner circumference end, toward the second pad portion 202C, which is an outer circumference end, when viewed from above. The second inductor wiring line 22C is spirally wound in the counterclockwise direction from the first pad portion 203C, which is an inner circumference end, toward the second pad portion 204C, which is an outer circumference end, when viewed from above.

Preferably, in the first embodiment, the average particle diameter of the metal magnetic powder 15 is about one thirtieth or more and about one third or less (i.e., from about one thirtieth to about one third) of an inscribed circle of an inner magnetic path viewed from the normal direction (Z-direction) of the first inductor wiring line 21 and the second inductor wiring line 22. With this, since the average particle diameter is about one thirtieth or more, the average particle diameter of the metal magnetic powder 15 does not become smaller than necessary, and the magnetic permeability obtainable by the inductor component 1 may be made large. Further, since the average particle diameter is about one third or less, it is possible for the inner magnetic path to be stably filled with the metal magnetic powder 15. The inscribed circle of the inner magnetic path refers to a circle having the largest diameter among the circles in contact with the inner circumference ends of the inductor wiring lines 21 when the inductor wiring lines 21 are viewed from the Z direction. For example, the average particle diameter of the metal magnetic powder 15 is about 45 µm, and the inscribed circle of the inner magnetic path is about 900 µm. Although the inductor wiring line 21 is covered with the insulation layer 60, the thickness of the insulation layer 60 is small, and therefore the thickness of the insulation layer 60 may not be taken into consideration.

In the above-described embodiment, two inductor wiring lines are disposed in the Z-direction, but three or more inductor wiring lines of different layers may be disposed in the Z-direction. When three or more inductor wiring lines of different layers are disposed in the Z-direction, a plurality of interlayer via conductors configured to electrically connect the three or more inductor wiring lines is provided. When the inductor component includes the plurality of interlayer via conductors, at least one central axis of the plurality of interlayer via conductors is different from the central axis of each of the first vertical wiring line and the second vertical wiring line.

Fifth Embodiment

Figure 6:
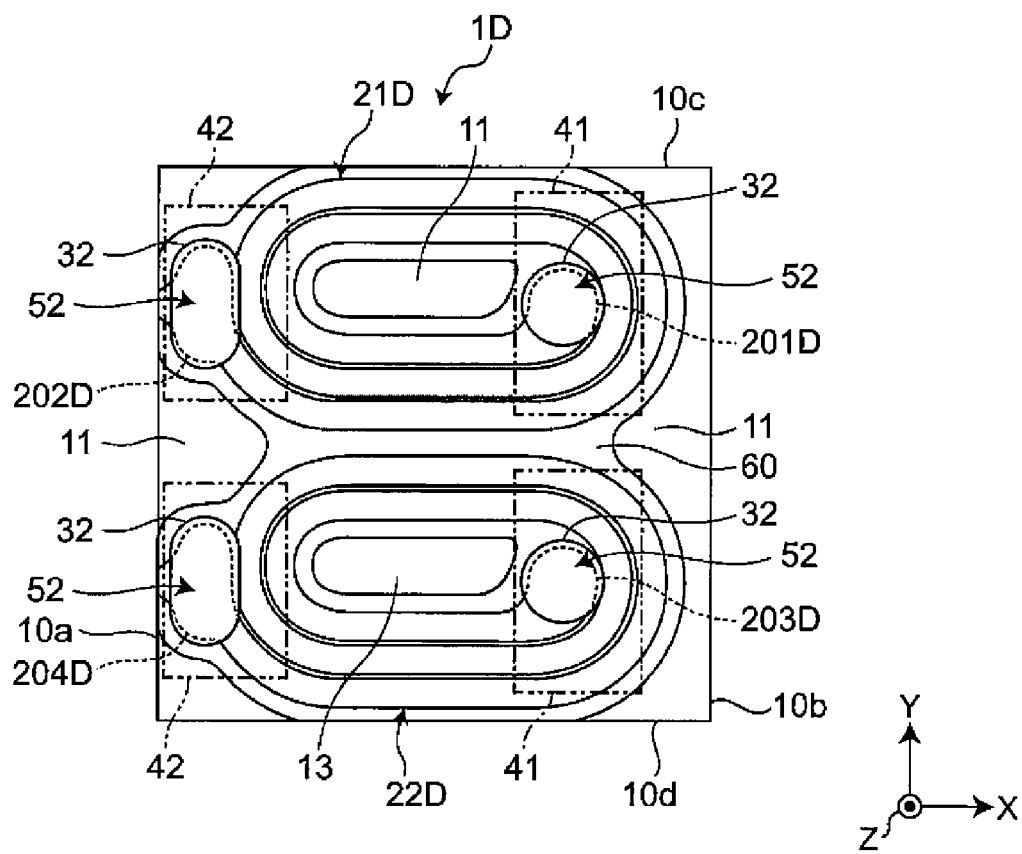
FIG. 6 is a perspective plan view illustrating an inductor component according to a fifth embodiment.

FIG. 6 is a perspective plan view illustrating a fifth embodiment of an inductor component. A configuration of an inductor wiring line (more specifically, the shape and the number of inductor wiring lines) of the fifth embodiment is different from that of the first embodiment. This different configuration will be described below. In the fifth embodiment, the same reference symbols as those in the other embodiments denote the same constituent elements as those in the first embodiment, and therefore, description thereof will be omitted.

As illustrated in FIG. 6, an inductor component 1D of the fifth embodiment includes, similarly to the inductor component 1 of the first embodiment, vertical wiring lines 51 and 52 extending in the Z-direction from inductor wiring lines 21D and 22D and passing through the inside of a magnetic layer 11. That is, the first vertical wiring line 51 and the second vertical wiring line 52 are connected to the first pad portions 201D and 203D of the first and second inductor wiring lines 21D and 22D, respectively, and the first vertical wiring line 51 and the second vertical wiring line 52 are connected to the second pad portions 202D and 204D of the first and second inductor wiring lines 21D and 22D, respectively.

In the inductor component 1D of the fifth embodiment, the first inductor wiring line 21D and the second inductor wiring line 22D substantially have a track shape formed of semicircular portions and straight-line portions when viewed from the Z-direction. The first and second inductor wiring lines 21D and 22D are spirally wound in the clockwise direction from the first pad portions 201D and 203D toward the second pad portions 202D and 204D, when viewed from the Z-direction.

On the other hand, the first and second inductor wiring lines 21D and 22D are in close proximity to each other. That is, magnetic flux generated in the first inductor wiring line 21D wraps around the second inductor wiring line 22D in close proximity thereto, and magnetic flux generated in the second inductor wiring line 22D wraps around the first inductor wiring line 21D in close proximity thereto. Accordingly, the magnetic coupling between the first inductor wiring line 21D and the second inductor wiring line 22D becomes strong.

When a current from the first pad portions 201D and 203D of one of the first and second inductor wiring lines 21D and 22D toward the second pad portions 202D and 204D, and a current from the second pad portions 204D and 202D of the other inductor wiring line toward the first pad portions 203D and 201D flow at the same time, the magnetic fluxes intensify each other. This means that the first inductor wiring line 21D and the second inductor wiring line 22D are in the form of positive coupling in the case where the first pad portions 201D and 203D of one of the first and second inductor wiring lines 21D and 22D are taken as an input side of a pulse signal while the second pad portions 202D and 204D thereof are taken as an output side of the pulse signal, and the second pad portions 204D and 202D of the other inductor wiring line are taken as an input side of the pulse signal while the first pad portions 203D and 201D thereof are taken as an output side of the pulse signal.

On the other hand, as for the first and second inductor wiring lines 21D and 22D, when currents flow from the first pad portions 201D and 203D toward the second pad portions 202D and 204D at the same time, or current flow from the second pad portions 202D and 204D toward the first pad portions 201D and 203D at the same time, the magnetic fluxes cancel out each other. This means that the first inductor wiring line 21D and the second inductor wiring line 22D are in the form of positive coupling in the case where the first pad portions 201D and 203D of the first and second inductor wiring lines 21D and 22D are taken as an input side of a pulse signal while the second pad portions 202D and 204D thereof are taken as an output side of the pulse signal, or the second pad portions 202D and 204D thereof are taken as the input side of the pulse signal while the first pad portions 201D and 203D thereof are taken as the output side of the pulse signal.

In the above-described embodiment, two inductor wiring lines are disposed on the same plane, but three or more inductor wiring lines may be disposed on the same plane.

Sixth Embodiment

Figure 7A:
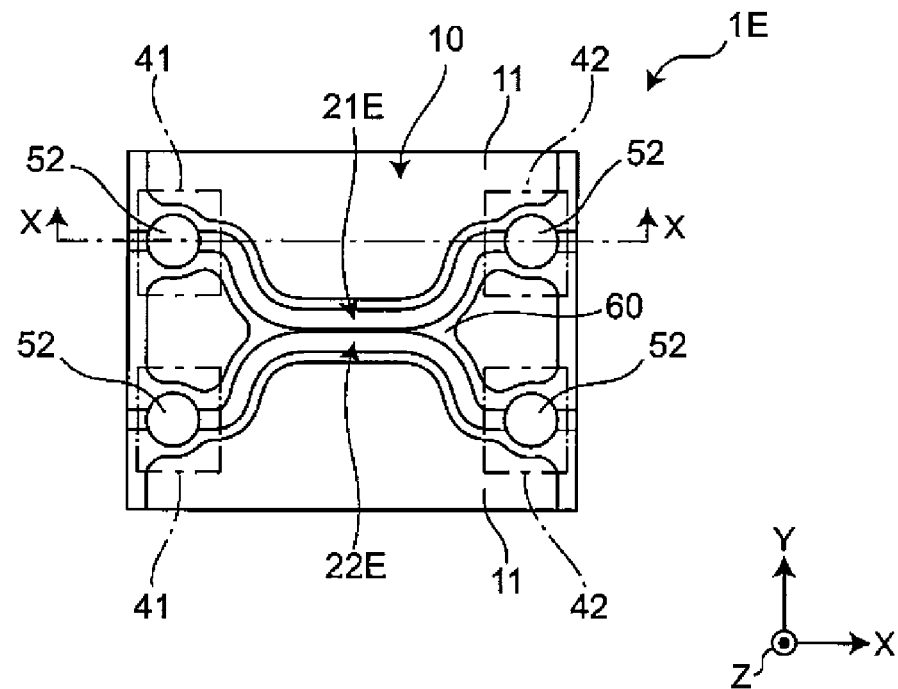
FIG. 7A is a perspective plan view illustrating an inductor component according to a sixth embodiment.
Figure 7B:
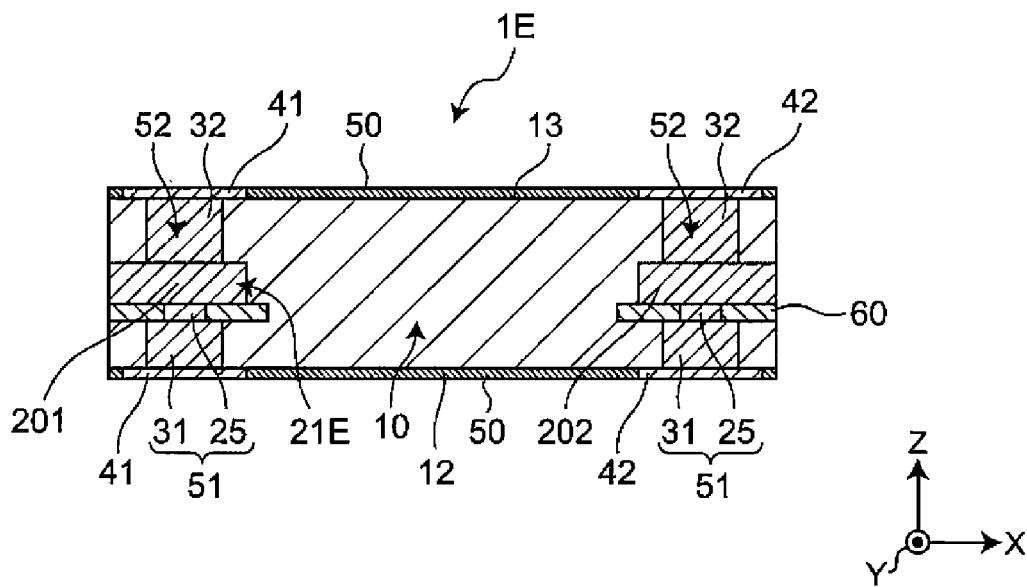
FIG. 7B is a cross-sectional view taken along a line X-X in FIG. 7A.

FIG. 7A is a perspective plan view illustrating a sixth embodiment of an inductor component. FIG. 7B is a cross-sectional view taken along a line X-X in FIG. 7A. A configuration of an inductor wiring line (more specifically, the shape of an inductor wiring line) of the sixth embodiment is different from that of the fifth embodiment. This different configuration will be described below. In the sixth embodiment, the same reference symbols as those in the other embodiments denote the same constituent elements as those in the sixth embodiment, and therefore, description thereof will be omitted.

In an inductor component 1E of the sixth embodiment, first and second inductor wiring lines 21E and 22E are each formed in a semi-elliptical arc shape when viewed from the Z-direction. The arcs of the inductor wiring lines 21E and 22E are formed to project in a direction in which the arcs approach each other. That is, the first and second inductor wiring lines 21E and 22E are each a curved wiring line wound about half a turn. Each of the inductor wiring lines 21E and 22E includes a linear portion at the intermediate portion thereof. The first and second inductor wiring lines 21E and 22E may each be a curved line in which the number of turns is less than one.

In each of the first and second inductor wiring lines 21E and 22E, a range surrounded by a curve drawn by the inductor wiring lines 21E and 22E and a straight line connecting both ends of the inductor wiring lines 21E and 22E is defined as an inner diameter portion. At this time, as viewed in the Z-direction, inner diameter portions of the inductor wiring lines 21E and 22E do not overlap each other.

In the first and second inductor wiring lines 21E and 22E, when currents flow from first pad portions 201 on the same side toward second pad portions 202 on the opposite side thereto at the same time, the magnetic fluxes intensify each other. This means that the first inductor wiring line 21E and the second inductor wiring line 22E are in the form of positive coupling in the case where each of the first pad portions 201 of the first inductor wiring line 21E and the second inductor wiring line 22E is taken as an input side of a pulse signal, and each of the second pad portions 202 thereof is taken as an output side of the pulse signal. On the other hand, for example, when the first pad portion 201 side of the first inductor wiring line 21E is taken as input while the second pad portion 202 side thereof is taken as output, and the first pad portion 201 side of the second inductor wiring line 22E is taken as output while the second pad portion 202 side thereof is taken as input, the first inductor wiring line 21E and the second inductor wiring line 22E may be brought into a state of negative coupling.

Preferably, the average particle diameter of the metal magnetic powder 15 is about one thirtieth or more and about one third or less (i.e., from about one thirtieth to about one third) of a maximum distance between the first inductor wiring line 21E and the second inductor wiring line 22E. With this, since the average particle diameter is about one thirtieth or more, the average particle diameter of the metal magnetic powder 15 does not become smaller than necessary, and the magnetic permeability obtainable by the inductor component 1E may be made large. Further, since the average particle diameter is about one third or less, it is possible to stably fill the metal magnetic powder 15 into between the first inductor wiring line 21E and the second inductor wiring line 22E. The maximum distance between the first inductor wiring line 21E and the second inductor wiring line 22E refers to the maximum distance when the first and second inductor wiring lines 21E and 22E are viewed from the Z-direction. Although the first and second inductor wiring lines 21E and 22E are covered with an insulation layer 60, the thickness of the insulation layer 60 is small, and therefore the thickness of the insulation layer 60 may not be taken into consideration.

Seventh Embodiment

Figure 8:
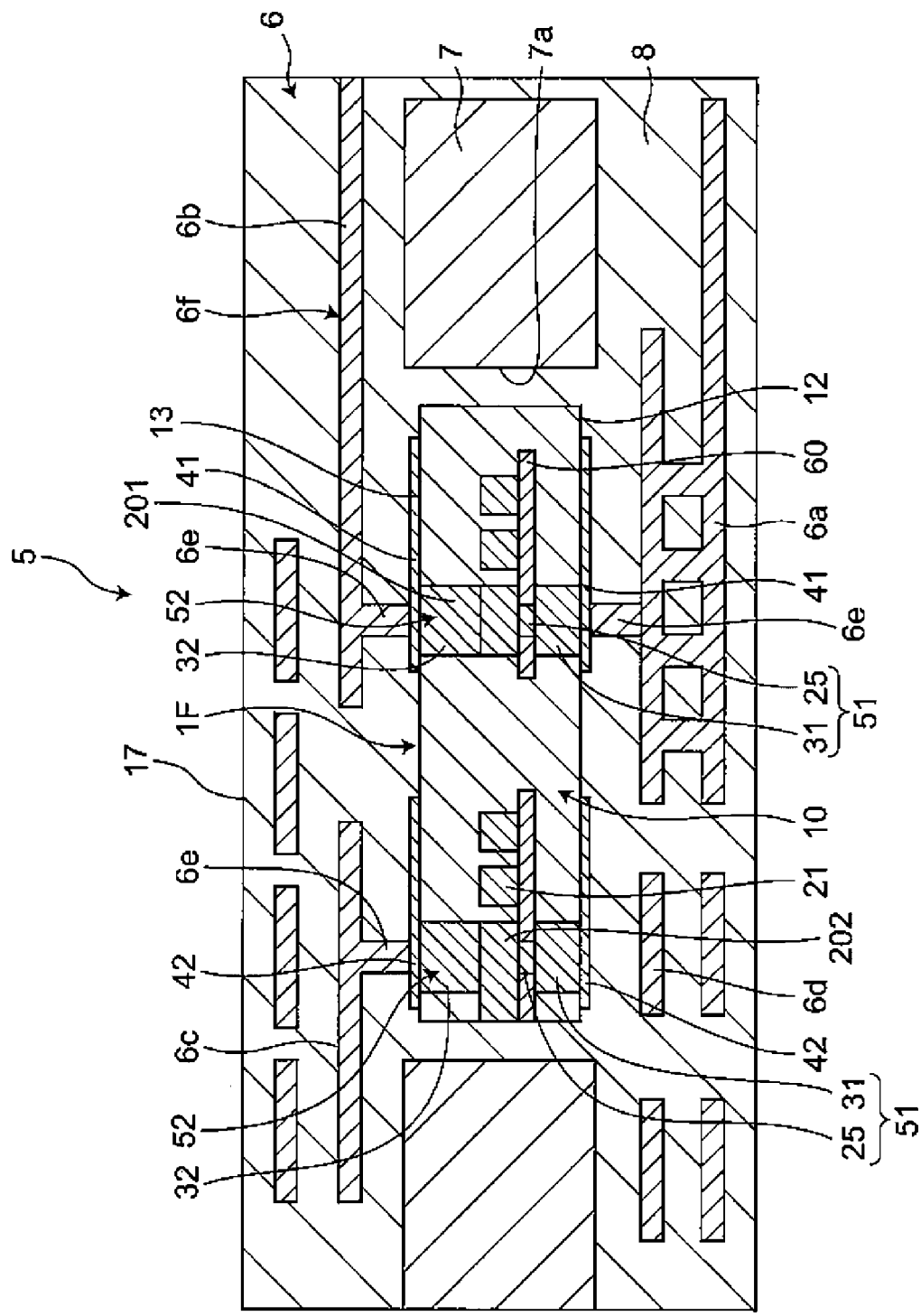
FIG. 8 is a cross-sectional view of a substrate with a built-in inductor component according to a seventh embodiment.

FIG. 8 is a cross-sectional view illustrating a seventh embodiment of a substrate with a built-in inductor component. As illustrated in FIG. 8, a substrate with a built-in inductor component 5 of the seventh embodiment includes an inductor component 1F, a substrate 6 in which the inductor component 1F is embedded, and a substrate wiring line 6f. The substrate wiring line 6f includes pattern portions 6a to 6d extending in a direction along a principal surface (substrate principal surface 17) of the substrate 6, and a substrate via portion 6e extending in a thickness direction of the substrate 6. The substrate wiring line 6f is connected to the inductor component 1F at the substrate via portion 6e.

The inductor component 1F differs from the inductor component 1 of the first embodiment in that the inductor component 1F does not include a covering film 50; other constituent elements are the same as those of the inductor component 1 of the first embodiment, and therefore, description thereof will be omitted.

The substrate 6 includes a core material 7 and an insulation layer 8. The inductor component 1F is disposed in a through-hole 7a of the core material 7, and is covered with the insulation layer 8 together with the core material 7. In the case where irregularities are formed on principal surfaces 12 and 13 of a main body 10 in the inductor component 1F, since the insulation layer 8 covers the principal surfaces 12 and 13 having the irregularities, the close contact property between the principal surfaces 12, 13 and the insulation layer 8 is improved due to the anchor effect.

It is preferable that the principal surfaces 12 and 13 of the main body 10 of the inductor component 1F be parallel to the substrate principal surface 17. When the principal surfaces 12 and 13 of the inductor component 1F are parallel to the substrate principal surface 17, it is possible to further reduce the thickness of the substrate with the built-in inductor component 5. The inductor component 1F may be embedded in the substrate 6 in a state where the substrate principal surface 17, the principal surfaces 12, 13 of the main body 10, and a plane on which an inductor wiring line 21 is disposed are substantially parallel to one another. In this case, the Z-direction (the normal direction with respect to the plane on which the inductor wiring line 21 is disposed) in the inductor component 1F substantially coincides with the thickness direction of the substrate 6, and is substantially orthogonal to the substrate principal surface 17.

Outside terminals 41 and 42 of the inductor component 1F are directly connected to the substrate via portion 6e. That is, the substrate wiring line 6f is connected to the outside terminals 41 and 42 of the inductor component 1F at the substrate via portion 6e. The substrate via portion 6e includes a first via portion connected to the inductor component 1F from the upper side in the Z-direction, and a second via portion connected to the inductor component 1F from the lower side in the Z-direction. Specifically, the first outside terminal 41 connected to a first pad portion 201 via a first vertical wiring line 51 is connected to the first pattern portion 6a via the substrate via portion 6e (first via portion) on the lower side of the first outside terminal 41. The second outside terminal 42 connected to the first pad portion 201 via a second vertical wiring line 52 is connected to the second pattern portion 6b via the substrate via portion 6e (second via portion) on the upper side of the second outside terminal 42. The second outside terminal 42 connected to a second pad portion 202 via the second vertical wiring line 52 is connected to the third pattern portion 6c via the substrate via portion 6e (second via portion) on the upper side of the second outside terminal 42. Note that the first outside terminal 41 connected to the second pad portion 202 via the first vertical wiring line 51 is not connected to the fourth pattern portion 6d on the lower side of the first outside terminal 41.

Accordingly, since the substrate with the built-in inductor component 5 includes the inductor component 1F, the degree of freedom in circuit design may be enhanced. Preferably, the pattern portions 6a to 6d of the substrate wiring line 6f are disposed in parallel to the plane on which the inductor wiring line 21 is disposed. This makes it possible to thin the substrate with the built-in inductor component 5.

In short, in the substrate with the built-in inductor component 5, the inductor wiring line 21 of the inductor component 1F and the substrate wiring line 6f are connected by the substrate via portion 6e and the vertical wiring lines 51, 52 extending in the Z-direction. This means that the inductor wiring line 21 and the substrate wiring line 6f are connected to each other with no extra wiring. In the substrate with the built-in inductor component 5, it is possible to effectively utilize an empty space brought by the omission of the extra routing, and thus it is possible to enhance the degree of freedom in circuit design in comparison with the inductor component, the substrate with the built-in inductor component, and the like of related art.

Further, in the substrate with the built-in inductor component 5, since there is no extra wiring, it is possible to decrease wiring resistance. Furthermore, in the substrate with the built-in inductor component 5, by embedding the inductor component 1F relatively small in size in the substrate 6, it is possible to reduce the size and thickness of the circuit as a whole.

The substrate wiring line 6f is electrically connected from both sides (upper and lower sides) in the Z-direction of the inductor component 1F. In this case, layout options of the pattern portions 6a to 6d are increased and the degree of freedom in circuit design is enhanced, in comparison with the substrate with the built-in inductor component of related art in which the substrate wiring line is connected only from one side of the inductor component 1F.

As described in the first embodiment, in the inductor component 1F, since the area of the outside terminals 41 and 42 is larger than the area of columnar wiring lines 31 and 32 when viewed from the Z-direction, it is possible to increase the area of the outside terminals 41 and 42. Accordingly, at the time of embedding the inductor component 1F in the substrate 6, when the substrate via portion 6e to be connected to the outside terminal of the inductor component 1F is provided in the substrate 6, it is possible to secure a large margin for the forming position of the substrate via portion 6e with respect to the outside terminals 41 and 42, thereby making it possible to improve the yield at the time of embedding.

In FIG. 8, only the inductor component 1F and the substrate wiring line 6f are described in the substrate with the built-in inductor component 5, but another electronic component such as a semiconductor component, a capacitor component, or a resistor component may be embedded in the substrate with the built-in inductor component 5. Another electronic component may be surface-mounted on the substrate principal surface 17, or a semiconductor chip may be joined to the substrate principal surface 17. The inductor components of the second to sixth embodiments may be embedded in the substrate with the built-in inductor component of the seventh embodiment instead of the inductor component 1F.

It should be noted that the present disclosure is not limited to the above-described embodiments, and design changes may be made without departing from the gist of the present disclosure. For example, the feature points of the first to seventh embodiments may be variously combined with each other. In each of the first to seventh embodiments, even in the case where the action effects described in the other embodiments are not particularly mentioned and the description thereof is omitted in the embodiment, the same action effects may also be basically exhibited in the embodiment when the embodiment has the same configuration.

In the above-described embodiments, the inductor wiring line is a spiral wiring line, but the inductor wiring line is not limited to the above-described embodiments and may have various well-known structures and shapes, such as a straight shape, a meander shape, and a helical shape. That is, the inductor wiring line of the present disclosure provides inductance to the inductor component by generating magnetic flux in the magnetic layer when a current flows therethrough, and the structure, shape, material, and the like thereof are not particular limited.

In the above-described embodiments, the inductor wiring line has the first surface covered with an insulation layer, and at least part of the side surface of the inductor wiring line may be further covered with the insulation layer to further improve the insulating property between wiring lines of the inductor wiring lines. The number of inductor wiring lines may be increased or decreased without departing from the gist of the present disclosure.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:
1. An inductor component comprising:
a main body that has a flat-plate shape and includes a magnetic layer containing a resin and metal magnetic powder contained in the resin;
an inductor wiring line disposed on a plane inside the main body, the inductor wiring line directly contacting the magnetic layer;
a first vertical wiring line that extends, from a pad portion which is an end portion of the inductor wiring line, in a first direction which is a normal direction with respect to the plane, to pass through the inside of the main body, and is exposed on a first principal surface side of the main body;
a second vertical wiring line that extends, from the pad portion of the inductor wiring line, in a second direction which is a normal direction with respect to the plane, to pass through the inside of the main body, and is exposed on a second principal surface side of the main body; and
an insulation layer of a non-magnetic body in contact with at least, of a first surface on the first direction side and a side surface of the inductor wiring line, the first surface,
wherein the first vertical wiring line includes a via conductor that extends from the pad portion toward the first direction side and passes through the inside of the insulation layer, and a columnar wiring line that extends from the via conductor toward the first direction side and passes through the inside of the magnetic layer, and the second vertical wiring line includes a columnar wiring line that extends from the pad portion toward the second direction side and passes through the inside of the magnetic layer.

2. The inductor component according to claim 1, wherein
the side surface of the inductor wiring line has a tapered shape such that a width of the first surface of the inductor wiring line is larger than a width of a second surface on an opposite side to the first surface of the inductor wiring line, and
the via conductor of the first vertical wiring line is connected to the first surface of the inductor wiring line.

3. The inductor component according to claim 1, wherein
a central axis of the first vertical wiring line and a central axis of the second vertical wiring line are present on an identical axis.

4. The inductor component according to claim 1, wherein
a cross-sectional area of the first vertical wiring line and a cross-sectional area of the second vertical wiring line are different from each other.

5. The inductor component according to claim 1, wherein
the insulation layer is in contact with at least part of the side surface of the inductor wiring line.

6. The inductor component according to claim 1, wherein
the insulation layer includes at least one among an epoxy-based resin, a phenol-based resin, a polyimide-based resin, an acrylic-based resin, and a vinyl ether-based resin.

7. The inductor component according to claim 1, wherein
as for the first vertical wiring line and the second vertical wiring line, a minimum distance to the metal magnetic powder is equal to or less than 200 nm.

8. The inductor component according to claim 1, wherein
a minimum distance between the inductor wiring line and the metal magnetic powder is equal to or less than 200 nm.

9. The inductor component according to claim 1, wherein
the magnetic layer includes a principal surface that has irregularities and is parallel to the plane, and
an arithmetic average roughness $R_a$ of the irregularities of the principal surface of the magnetic layer is one tenth or less of a thickness T of the magnetic layer.

10. The inductor component according to claim 1, further comprising:
a covering film provided on a surface of the magnetic layer.

11. The inductor component according to claim 1, wherein
a plurality of the inductor wiring lines is laminated in the normal direction.

12. The inductor component according to claim 11, further comprising:
a plurality of interlayer via conductors configured to connect the inductor wiring lines of different layers in the normal direction,
wherein at least one central axis of the plurality of interlayer via conductors is on a different axis from the central axis of each of the first vertical wiring line and the second vertical wiring line.

13. The inductor component according to claim 1, wherein
the inductor wiring line includes a first inductor wiring line and a second inductor wiring line, and
an average particle diameter of the metal magnetic powder is from one thirtieth to one third of an inscribed circle of an inner magnetic path when viewed from the normal direction of the first inductor wiring line and the second inductor wiring line.

14. The inductor component according to claim 1, wherein
the inductor wiring line includes a first inductor wiring line and a second inductor wiring line, and
an average particle diameter of the metal magnetic powder is from one thirtieth to one third of a maximum distance between the first inductor wiring line and the second inductor wiring line.

15. The inductor component according to claim 1, wherein
the average particle diameter of the metal magnetic powder is from one tenth to two-thirds of the thickness T of the magnetic layer.

16. The inductor component according to claim 1, wherein
the magnetic layer further contains ferrite powder.

17. The inductor component according to claim 1, wherein
the magnetic layer contains non-magnetic powder made of an insulator.

18. A substrate with a built-in inductor component, comprising:
the inductor component according to claim 1;
a substrate in which the inductor component is embedded; and
a substrate wiring line including a pattern portion extending in a direction along a principal surface of the substrate, and a substrate via portion extending in a thickness direction of the substrate,
wherein the substrate wiring line is connected to the inductor component at the substrate via portion.

19. The substrate with the built-in inductor component according to claim 18, wherein
the pattern portion of the substrate wiring line is disposed in parallel to the plane on which the inductor wiring line is disposed.

20. An inductor component comprising:
a main body that has a flat-plate shape and includes a magnetic layer containing a resin and metal magnetic powder contained in the resin;
an inductor wiring line disposed on a plane inside the main body;
a first vertical wiring line that extends, from a pad portion which is an end portion of the inductor wiring line, in a first direction which is a normal direction with respect to the plane, to pass through the inside of the main body, and is exposed on a first principal surface side of the main body;
a second vertical wiring line that extends, from the pad portion of the inductor wiring line, in a second direction which is a normal direction with respect to the plane, to pass through the inside of the main body, and is exposed on a second principal surface side of the main body; and
an insulation layer of a non-magnetic body in contact with at least, of a first surface on the first direction side and a side surface of the inductor wiring line, the first surface,
wherein the first vertical wiring line includes a via conductor that extends from the pad portion toward the first direction side and passes through the inside of the insulation layer, and a columnar wiring line that extends from the via conductor toward the first direction side and passes through the inside of the magnetic layer, the second vertical wiring line includes a columnar wiring line that extends from the pad portion toward the second direction side and passes through the inside of the magnetic layer, the side surface of the inductor wiring line has a tapered shape such that a width of the first surface of the inductor wiring line is larger than a width of a second surface on an opposite side to the first surface of the inductor wiring line, and the via conductor of the first vertical wiring line is connected to the first surface of the inductor wiring line.

* * * * *